(12) United States Patent
Argyres et al.

(10) Patent No.: US 7,589,362 B1
(45) Date of Patent: Sep. 15, 2009

(54) CONFIGURABLE NON-VOLATILE LOGIC STRUCTURE FOR CHARACTERIZING AN INTEGRATED CIRCUIT DEVICE

(75) Inventors: Dimitri Argyres, San Jose, CA (US); Bindiganavale S. Nataraj, Cupertino, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 177 days.

(21) Appl. No.: 11/764,157

(22) Filed: Jun. 15, 2007

Related U.S. Application Data

(60) Continuation-in-part of application No. 11/745,415, filed on May 7, 2007, which is a division of application No. 10/883,161, filed on Jul. 1, 2004, now Pat. No. 7,215,004.

(60) Provisional application No. 60/916,549, filed on May 7, 2007.

(51) Int. Cl.
*H01L 27/108* (2006.01)
*H01L 29/94* (2006.01)

(52) U.S. Cl. .................................. 257/208; 257/209
(58) Field of Classification Search ................ 257/208, 257/209, 210, 211, 225, 296, 798
See application file for complete search history.

(56) References Cited

U.S. PATENT DOCUMENTS

| | | | |
|---|---|---|---|
| 4,447,887 A * | 5/1984 | Imazeki et al. ............. | 711/116 |
| 5,294,812 A | 3/1994 | Hashimoto et al. | |
| 6,446,017 B1 | 9/2002 | Skidmore | |
| 6,622,102 B2 | 9/2003 | Skidmore | |
| 6,629,309 B1 * | 9/2003 | Allen, III ..................... | 716/16 |
| 6,750,479 B2 | 6/2004 | Haag | |
| 6,904,124 B2 * | 6/2005 | Staver et al. ................. | 378/62 |
| 2002/0085163 A1 | 7/2002 | Park et al. | |
| 2002/0152043 A1 | 10/2002 | Skidmore | |
| 2004/0251470 A1 | 12/2004 | Catalasan et al. | |
| 2004/0251472 A1 | 12/2004 | Catalasan et al. | |
| 2004/0253778 A1 | 12/2004 | Catalasan et al. | |

FOREIGN PATENT DOCUMENTS

| | | |
|---|---|---|
| EP | 1341214 A1 | 9/2003 |
| JP | 01305495 A2 | 12/1989 |
| WO | WO2004021022 A2 | 3/2004 |
| WO | WO2004021022 A3 | 3/2004 |

* cited by examiner

*Primary Examiner*—S. V Clark
(74) *Attorney, Agent, or Firm*—Shemwell Mahamedi LLP; William L. Paradice, III

(57) ABSTRACT

An integrated circuit (IC) device including a substrate, a plurality of device layers formed over the substrate, and a plurality of multi-level revision (MLR) structures that generate a revision code indicative of device revisions. Each MLR group structure includes a number of MLR cells and includes a parity circuit having a number of inputs coupled to the outputs of the MLR cells and having an output to generate a corresponding bit of the revision code. The MLR cells in each MLR group structure are assigned to different device layers, and each device layer is assigned to one MLR cell in each MLR group structure. Each revision code bit is controllable by any MLR cell in the corresponding MLR group structure.

26 Claims, 15 Drawing Sheets

CONFIGURABLE NON-VOLATILE LOGIC STRUCTURE FOR CHARACTERIZING AN INTEGRATED CIRCUIT DEVICE

CROSS-REFERENCE TO RELATED APPLICATIONS

This application claims the benefit under 35 USC 119(e) of co-pending and commonly owned U.S. Provisional Patent Application No. 60/916,549 entitled "Configurable Non-volatile Logic Structure for Characterizing an Integrated Circuit Device" filed on May 7, 2007, and is a continuation-in-part and claims the benefit under 35 USC 120, of co-pending and commonly owned U.S. patent application Ser. No. 11/745,415 entitled "Integrated Circuit Device with Electrically Accessible Device Identifier" filed on May 7, 2007, which is a divisional of commonly owned U.S. patent application Ser. No. 10/883,161 entitled "Integrated Circuit Device with Electrically Accessible Device Identifier" filed on Jul. 1, 2004, issued May 8, 2007 as U.S. Pat. No. 7,215,004, all of which are incorporated by reference herein.

FIELD OF THE INVENTION

The present invention relates generally to the field of integrated circuit technology, and more particularly to run-time determination of integrated circuit device characteristics.

BACKGROUND

Integrated circuit devices are usually marked with various identifying information, such as device type, production date, manufacturer and so forth. Such marking is often formed directly on the integrated circuit die, for example, by etching alphanumeric characters into the substrate or oxide layer. Unfortunately, once the die is encapsulated within an opaque package housing, the on-die marking is no longer visible. Consequently, unless the desired information is printed on the package housing, the package may need to be disassembled to access the on-die information. Even when the desired information is printed on the device housing, visual inspection is still typically required to recover the information and may be difficult or impractical due to the mounting orientation of the device (e.g., print-side down), inaccessibility of the device within a system, or inaccessibility of the system itself.

BRIEF DESCRIPTION OF THE DRAWINGS

The present invention is illustrated by way of example, and not by way of limitation, in the Figures of the accompanying drawings and in which like reference numerals refer to similar elements and in which.

Like reference numerals refer to corresponding parts throughout the drawing figures.

DETAILED DESCRIPTION

Figure 1:
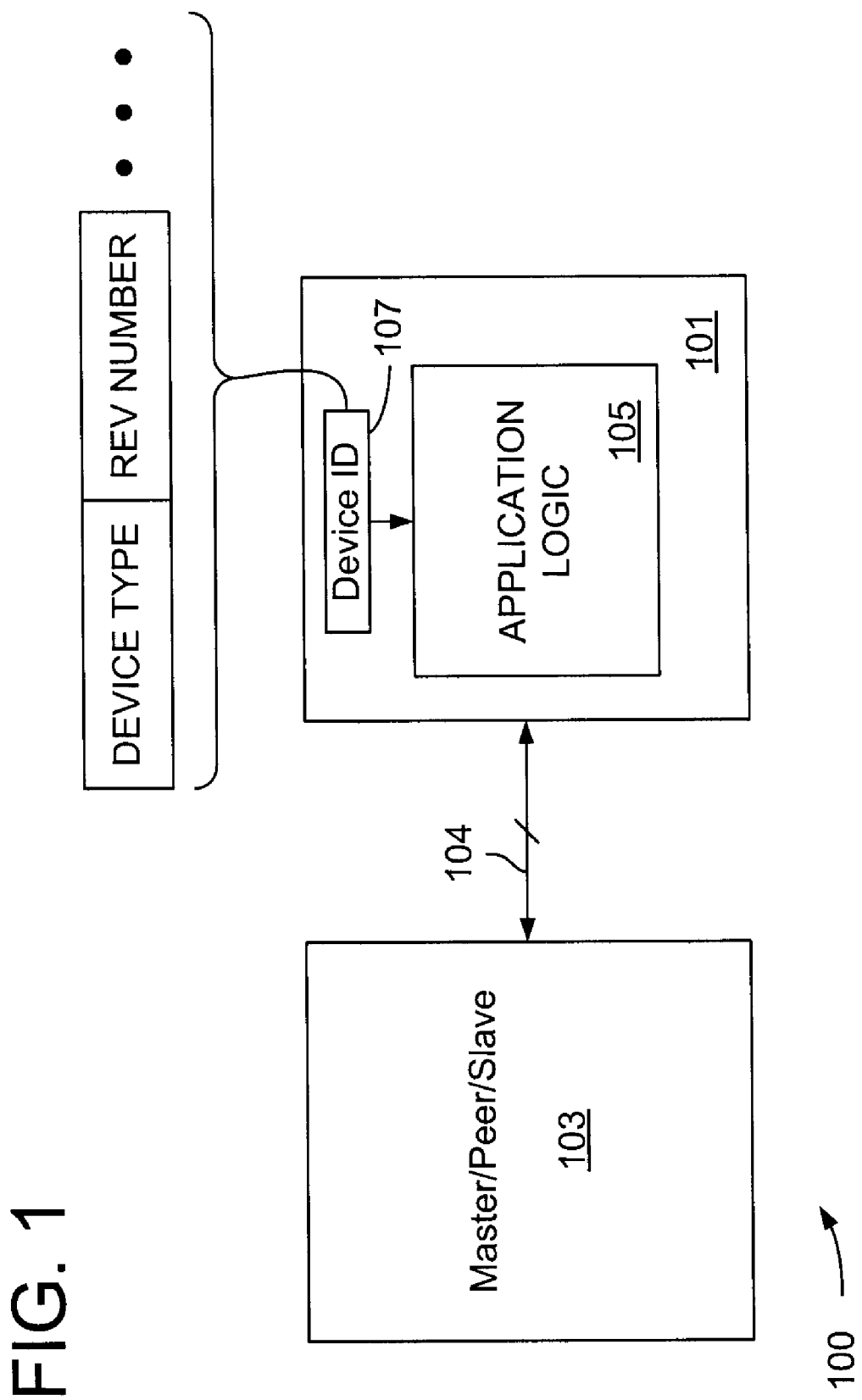
FIG. 1 shows an electronic system in which embodiments of the invention may be used.

In the following description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single-conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "terminal" is used to mean a point of electrical connection. The term "exemplary" is used to express but an example, and not a preference or requirement.

In embodiments of the present invention, an electronically accessible device identification (ID) structure is formed on the integrated circuit device to permit an external device or remote system to read ID information from the integrated circuit device during device operation. The ID information may also be used by other circuitry formed on the integrated circuit device, for example, to determine one or more configuration settings, communication protocols or other operating characteristics.

In one embodiment, the device ID structure is formed by one-time programmable circuitry such as a non-volatile storage register or fused circuit that may be programmed with the desired identification information. In another embodiment, the device ID structure is hardwired during device fabrication to establish the desired device identification. In other embodiments, the device ID information is provided by a combination of programmable circuitry and hardwired circuitry.

In particular device ID structure embodiments described below, revision information (i.e., indicating the revision of a particular product design) and other device ID information is manifested in hardwired structures referred to herein as multi-layer revision cells. In one embodiment, each multi-layer revision cell includes a pull-up circuit (or pull-down circuit) and a continuity stack that extends in a continuous signal path through each mask-generated layer of the device to a reference voltage node (e.g., ground). When a given device layer is revised, a continuity element or other connectivity structure contributed to the continuity stack by the revised layer is removed, thereby interrupting the continuous signal path to the reference voltage node and signaling the revision. By this operation, a revision is signaled by a modification in the revised layer itself, avoiding the need to revise otherwise unchanged layers merely to signal the revision. These and other aspects and embodiments of the invention are described below.

FIG. 1 illustrates an electronic system 100 in which embodiments of the invention may be used. The system 100 includes integrated circuit devices 101 and 103 interconnected through one or more signal paths 104. The integrated circuit devices 101 and 103 may operate, respectively, as master and slave or vice-versa, or as peers, or may switch between master, slave and/or peer roles at different times. Also, the integrated circuit devices 101 and 103 may be implemented in separately packaged integrated circuit dice, in separate dice packaged together in a common package (e.g., multi-chip package, paper thin package, etc.), or in a single die as in the case of a system-on-chip or multi-functional application-specific integrated circuit (ASIC).

Integrated circuit device 101 includes application logic 105 and a device ID circuit 107. The application logic 105 may include any number of circuit blocks as necessary to carry out the core functions of the ID device 101. The device ID circuit may hold information of various types including, without limitation, device type and revision number as shown, as well as manufacturing information (e.g., date, location, lot number, process-type, name of manufacturer etc.), tolerance information, or any other information that may be used to identify or characterize the integrated circuit device 101. The integrated circuit device 103 may access the device ID circuit 107 directly, receiving device ID information via one or more of signal paths 104, or may issue one or more instructions to the application logic 105, requesting the application logic 105 to obtain information from the device ID circuit 107 and output the information via signal paths 104. In either case, the integrated circuit device 103 may use the device identification information for configuration control or other purposes, and may output the information to other devices or systems.

Figure 2:
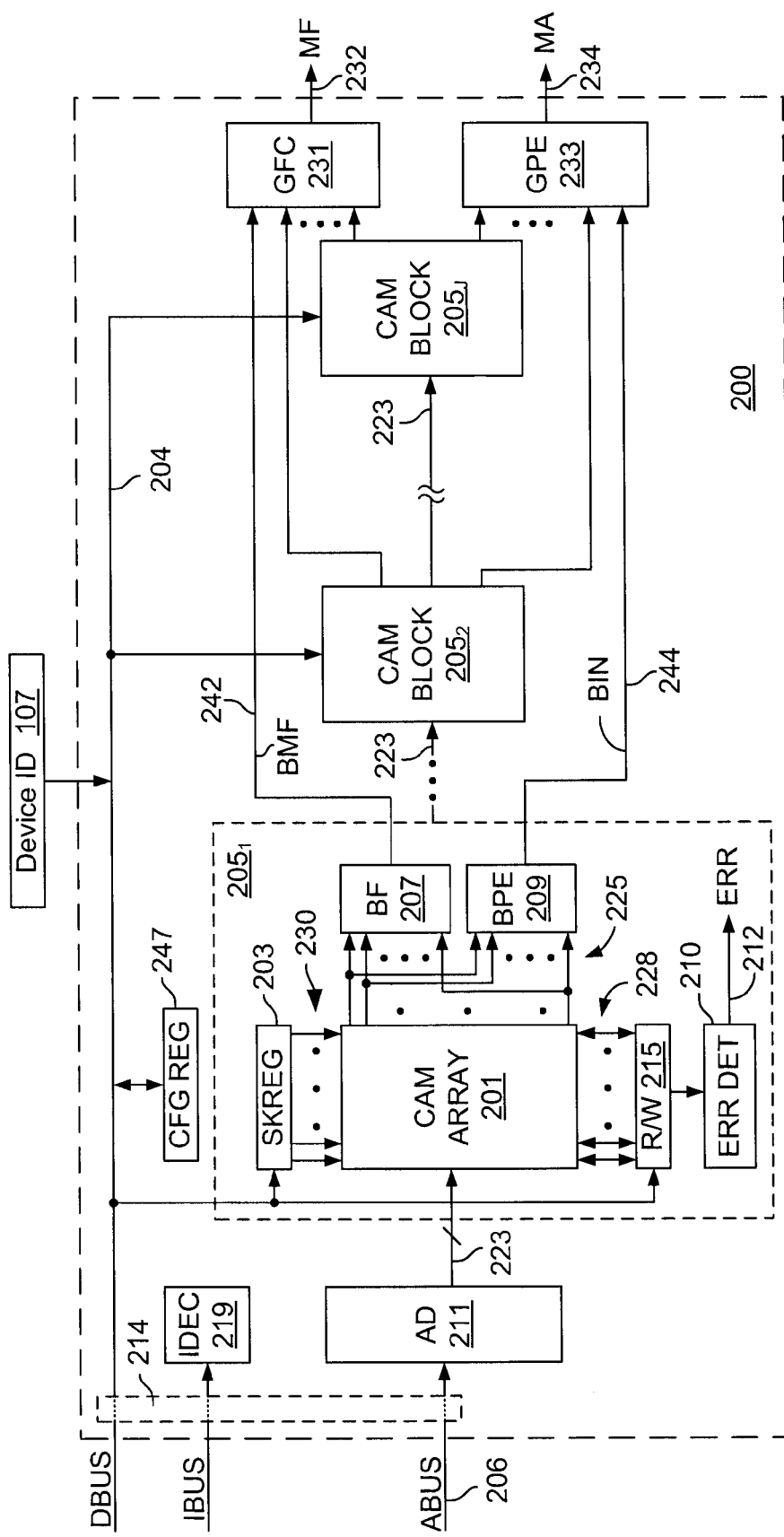
FIG. 2 shows an embodiment of the integrated circuit device of FIG. 1 in which the application logic includes a content addressable memory device.

FIG. 2 illustrates an embodiment of the integrated circuit device 101 of FIG. 1 in which the application logic 105 includes a content addressable memory (CAM) device 200. The CAM device 200 is used to compare search keys received via a data bus (DBUS) with contents of a database stored in one or more internal associative storage arrays, referred to herein as CAM arrays. If a search key matches an entry in the database, the CAM device 200 generates a match address (MA) that corresponds to the matching entry and asserts a match flag (MF) to signal the match condition. The match address is then typically used to address another storage array to retrieve associated information (e.g., packet forwarding information, classification information, policy information, etc.). The storage array addressed by the match address may be included within the integrated circuit device 101 along with the CAM device 200, or may be located in another integrated circuit device.

The CAM device 200 includes multiple independently selectable CAM blocks, $205_1$-$205_J$, instruction decoder 219 (IDEC), address logic 211 (AD), global flag circuit 231 (GFC) and global priority encoder 233 (GPE). A number of other circuit blocks, not shown, may also be included within the CAM device 200 including, without limitation, input/output drivers, status registers, configuration circuits, associated storage, and so forth.

As shown in the detail view of CAM block $205_1$, each of the CAM blocks 205 includes a CAM array 201, block flag circuit 207 (BF), block priority encoder 209 (BPE), search key register 203 (SKREG), read/write circuit 215, and error detection logic 210. The CAM array 201 constitutes an associated storage for storing database entries, referred to herein as CAM words, and includes CAM cells (not specifically shown) arranged in rows and columns. Pre-charged match lines 225 are coupled to respective rows of the CAM cells, and bit line pairs 228 and compare line pairs 230 are coupled to respective columns of the CAM cells. Collectively, the bit line pairs form a data port for read/write access to address-selected rows of CAM cells, and the compare line pairs form a compare port for inputting search values (also called search keys and comparands) to the CAM array 201 during search operations. The CAM cells themselves are specialized store-and-compare circuits each having a storage element to store a constituent bit of a CAM word presented on the bit lines and a compare circuit for comparing the stored bit with a corresponding bit of a search value presented on the compare lines. In one embodiment, the compare circuits within the CAM cells of a given row are coupled in parallel to the match line for the row, with each compare circuit switchably forming a discharge path to discharge the match line if the stored bit and search bit do not match (other CAM cells arrangements may be used in alternative embodiments). By this arrangement, if any one bit of a CAM word does not match the corresponding bit of the search value, the match line for the row is discharged to signal the mismatch condition. If all the bits of the CAM word match the corresponding bits of the search value, the match line remains in its pre-charged state to signal a match. Because a comparand value is presented to all the rows of CAM cells in each search operation, a rapid, parallel search for a matching CAM word is performed.

The CAM array 201 may be populated with different types of CAM cells in different embodiments including, without limitation, binary, ternary and quaternary CAM cells. In the case of a ternary or quaternary CAM cell, one or more additional storage circuits may be provided to store masking information or encoded mask and data information, and multiple pairs of bit lines may be provided per column of CAM cells. Alternatively, one or more pairs of bit lines may be multiplexed for read/write access to different storage elements within a selected CAM cell. Also, in alternative embodiments, either the bit lines or compare lines may be eliminated and the remaining lines used for both search and data access operations.

Instructions such as database read, write and search instructions are issued to the CAM device 200 by a host processor, network processor or other control device (not shown in FIG. 2) via an instruction bus (IBUS). In the case of read and write instructions, the control device may additionally issue address values to the CAM device 200 via address bus (ABUS) to specify storage locations to be accessed within one or more of the CAM blocks 205. The instruction decoder 219 responds to instructions received via the instruction bus 202 by signaling other circuit blocks within the CAM device 200 to perform the instructed operation. The address logic 211 receives addresses from the address bus 206 and may include internal registers for storing addresses generated within the CAM device 200 including, without limitation, a next free address (NFA) register to store an address of the highest priority, unoccupied location within a CAM block (or all the CAM blocks); a highest priority match (HPM) register to store a match address generated after a search operation within the CAM device 200; an error check register to store an address of a storage location within a given CAM array (or all the CAM arrays) to be error-checked (e.g., for parity error, cyclic redundancy check error, error correction code error, or other error); and any other useful addresses. During a read or write access to the CAM array 201 within a given CAM block 205, the address source is selected by the address logic 211 in response to a control signal from the instruction decoder 219 (or other control circuitry), and decoded by the address logic 211 to activate a word line 223 that corresponds to a selected row of CAM cells within the CAM array 201. The read/write circuit 215 then outputs a write data value onto the bit lines 228 for storage in the selected row or, in the case of a read operation, senses a read data value output onto the bit lines by the selected row. In one embodiment, a read or write operation is carried out by activating an address-selected word line 223 that extends across the CAM arrays 201 in all or a portion of the CAM blocks $205_1$-$205_J$. Alternatively, separate word lines 223 and/or address logic 211 may be provided for each CAM block 205. A block address sub-field of the address is used to enable the read/write circuit 215 within one of the CAM blocks $205_1$-$205_J$, thereby resolving the overall read or write operation to a particular row of CAM cells (or portion thereof) within a particular CAM block 205. During an error checking operation, the sense amplifiers within all the CAM blocks $205_1$-$205_J$ (i.e., within the read/write circuits 215) may be enabled concurrently to enable data values to be read from the same row location within each CAM array 201 in each CAM block 205, and checked for error in a respective error detection circuit 210. Because separate compare lines 230 and bit lines 228 are provided within each of the CAM arrays 201, such error checking operations may be executed without interrupting (or interfering with) the stream of search operations executed within the CAM device 200.

In one embodiment, the error detection circuit 210 includes a parity checking circuit that generates one or more parity bits based on the CAM word read from the CAM array 201, then compares the generated parity bits to parity bits included in or with the CAM word. The parity bits may be generated by the read/write circuit at the time a write data value is written into the CAM array 201 or may be generated externally and provided as part of the write data. In either case, if the generated parity bits do not match the stored parity bits, the error may be signaled by assertion of an error signal 212 (ERR) and/or by recording an error status in a status register (not shown in FIG. 2) of the CAM device 200. The address from which the CAM word in error was read may be stored in a register for later access by the host processor, network processor or other control device. Instead of a parity-checking operation, the error detection circuit 210 may perform a cyclic redundancy check, checksum check, syndrome check (e.g., a syndrome generated from an error correction code) or any other type of error checking operation.

In the embodiment of FIG. 2, the search key register 203 is used to store a search value received via the data bus and includes compare line drivers to drive the search value onto compare lines of the corresponding CAM array 201. Alternatively, the search key register 203 may be omitted and the search value may be supplied directly from the data bus to the CAM array 201. Search key registers 203 within the different CAM blocks 205 may be provided with the same or different search values and may be enabled to drive the search values onto the compare lines of the corresponding CAM arrays 201 simultaneously, or in pipelined fashion. Also, mapping circuitry may be provided to map incoming bits of a search value to encoded values. In other embodiments, one or more of the CAM blocks $205_1$-$205_J$ may have a filter circuit that is programmable to selectively provide, as the search value to be input to the corresponding CAM array 201, one or more bits or fields of a value received via the data bus.

During a search operation within a given CAM block 205, search results generated within the CAM array 201 are output via match lines 225 to the block flag circuit 207 and block priority encoder 209. The block flag circuit 207 outputs a block match flag signal 242 to indicate whether a match has been detected in the corresponding CAM array 201, and may additionally output a multiple match flag signal (not shown) to indicate whether multiple matches have been detected within the CAM array 201. The block priority encoder 209 outputs a block index 244 (i.e., an address value) that corresponds to the CAM array location containing the highest priority database entry determined to match the comparand value. The relative priorities of database entries may be programmable within individual CAM blocks and/or from CAM block to CAM block. Alternatively, CAM word priority may be fixed within CAM blocks (e.g., according to a predetermined priority policy such as an address-dependent priority policy) and/or from CAM block to CAM block.

The block match flags from each of the CAM blocks $205_1$-$205_J$ are input to a global flag circuit 231 which generates a device match flag signal 232 according to whether any matches were detected in the CAM device 200. As with the block flag circuit 207, the global flag circuit 231 may also output a device multiple match flag signal to indicate whether multiple matches were detected in the CAM device 200. The block indices 244 generated by the CAM blocks $205_1$-$205_J$ are input to a global priority encoder 233 which determines a highest priority one of the block indices 244 and outputs a corresponding match address 234. The match address 234 includes the highest priority one of the block indices 244 together with a block address segment that identifies the CAM block 205 that sourced the highest priority block index. In one embodiment, the block priority encoder 209 within each CAM block 205 outputs a predetermined "no-match" code when none of the match signals 225 is asserted. The global priority encoder 233, in turn, treats the no-match code is as having a lowest of all possible priorities, so that a match detected within any of the CAM blocks $205_1$-$205_J$ will result in selection of the corresponding block index over the no-match code. In an alternative embodiment, the block match flags 242 are provided to the global priority encoder 233 along with the block indices 244. If a block match flag 242 is deasserted (i.e., to indicate that no match was detected within the corresponding CAM block 205), then the block index 244 from the same CAM block 205 is eliminated as a source of the block index portion of the match address 234.

In one embodiment, each match address 234 (or each match address for which the corresponding device match flag 232 is asserted) is supplied to the address logic 211 and used to read the corresponding CAM word from the indicated storage location (i.e., from a specified row of the CAM array 201 within a specified one of CAM blocks $205_1$-$205_J$) for error checking purposes. If an error is detected by the error detection circuit 210, then a qualifying error signal 212 is output from the CAM device along with the match address 234, to inform the host processor, network processor or other control device that the match address resulted from a match with a corrupted map word. Although output latency is increased by such error checking, the error checking operation may be executed concurrently with a subsequent search operation, so that search and error checking operations are effectively pipelined to maintain the search throughput of the CAM device.

In an alternative embodiment, a single CAM block 205 may be provided instead of the multiple CAM blocks $205_1$-$205_J$ depicted of FIG. 2. In such an embodiment, the global flag circuit 231 and global priority encoder 233 may be omitted, and the block flag circuit 207 and block priority encoder 209 used to source the match flag and match address, respectively. Also, in one embodiment, the data bus 204 is used to transmit write and read data to and from the CAM device 200 (i.e., in addition to delivering search values) and is therefore coupled to the read/write circuit 215 within each CAM block. In alternative embodiments, one or more of the address, instruction and data buses may be eliminated and the corresponding signals time multiplexed onto the remaining bus or buses. Also, each of the CAM blocks $205_1$-$205_J$ may be programmed to store and generate comparison results for one, two or more CAM words per row of CAM cells, in effect, enabling a programmable storage width and depth within the CAM block 205.

Still referring to FIG. 2, the device ID circuit 107 may be used to store device type and revision information as discussed above, and may also be used to store information specific to the CAM device 200 including, without limitation, timing information for timing operations within the CAM blocks 205 or other circuitry (e.g., controlling the timing of match latching signals according to performance measurements obtained during device production), error-control information for controlling error detection operations carried out by the error detector 210, priority policy information that may be used to select between different priority policies within the block priority encoders 209 and/or global priority encoder 233, shut-off information to selectively disable run-time operation of selected circuit blocks (e.g., for power savings purposes), instruction-set selection information for selecting between different instruction sets, and so forth. Thus, while the device ID circuit 107 is depicted as being coupled to the data bus, the device ID circuit may additionally be coupled to any number of other circuit blocks within the CAM device 200 as necessary to provide information thereto. In one embodiment, a run-time programmable configuration register 247 is also provided within the CAM device 200 and may be used to complement the information provided by the device ID circuit 107. That is, the device ID circuit 107 may be used to provide one-time programmed or hardwired information to the CAM device and/or external circuitry, while the configuration register 247 may be programmed with run-time selectable information (e.g., logical width-depth configuration of individual CAM arrays 201, block select codes to enable logical grouping of various CAM blocks 205 during search operations and so forth) which may, in some cases, be redundant with information provided by the device ID circuit 107.

Figure 3:
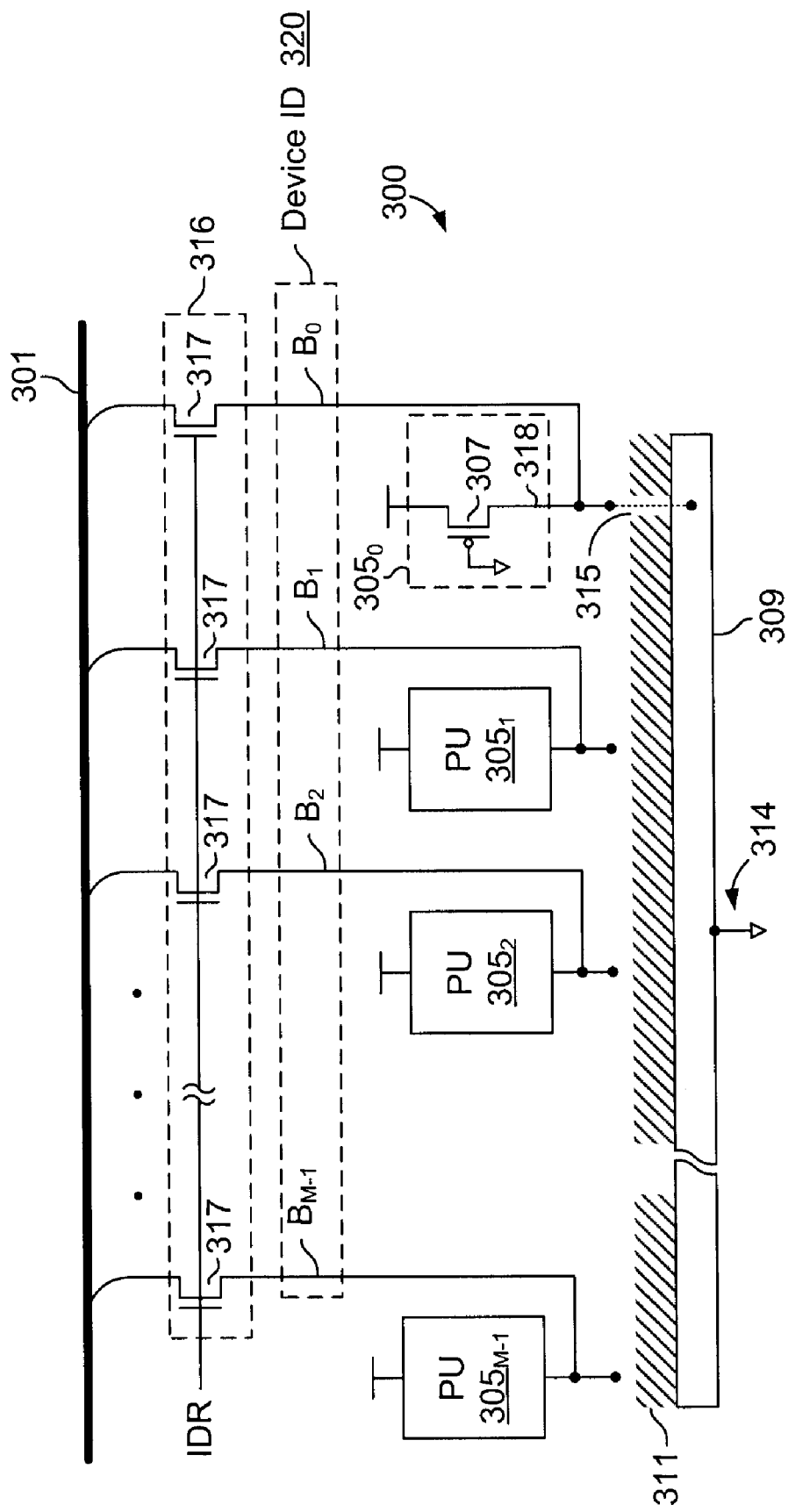
FIG. 3 shows a device identification circuit according to one embodiment.

FIG. 3 illustrates a device ID circuit 300 according to one embodiment. The device ID circuit 300 includes a plurality of pull-up circuits $305_0$-$305_{M-1}$ each coupled to a supply voltage, $V_S$, and, optionally, to a ground node 314. In the particular embodiment shown, each pull-up circuit 305 is formed by a P-type MOS (P-MOS) transistor 307 which is biased to act as a resistive element. That is, when the drain terminal 318 of the transistor 307 is coupled to ground, the resulting current flow through the transistor produces a voltage drop, $V_S$, and the drain terminal of the transistor, which constitutes the output node 318 of the pull-up circuit 305, is driven to a logic low state. By contrast, when the drain terminal of the transistor 307 is decoupled from ground, the output node 318 is pulled up substantially to $V_S$ to generate a logic high output. In the embodiment of FIG. 3, the ground node 314 connection is provided at a first interconnection layer 309 (referred to herein as a metal layer, though virtually any suitable conductive material may alternatively be used), disposed over the semiconductor substrate, with the pull-up circuits being formed by diffusion elements within the substrate. A dielectric layer 311 (e.g., an oxide such as silicon dioxide or other insulating material) is disposed between the metal layer 309 and the substrate. For each bit of the device ID 320 that is to be pulled low, a via 315 is formed in the dielectric layer 311 to establish electrical connection between the output node 318 of the pull-up circuit 305 and the metal layer 309. Thus, vias 315 may be selectively formed in the dielectric layer 311 to enable selective grounding of the output nodes 318 of pull-up circuits $305_0$-$305_{M-1}$, thereby forming an M-bit device ID value 320 that indicates the device type, revision number and/or other identification or characterizing information. In alternative embodiments, other types of resistive elements may be used in place of the P-MOS transistor 307, and pull-down rather than pull-up circuits may be used (e.g., selectively coupling drain terminals of N-type MOS transistors to a supply voltage). Moreover, the ground node connection may be established in any fabrication layer of the device, and other techniques for forming ground connections may be used.

Assuming that revision information is maintained in the device ID circuit 300, a change to a given fabrication layer of the integrated circuit device (e.g., a higher-level metal or dielectric layer, not shown) may necessitate a change in via layer 311 to signal revision in the device ID, even if the via layer 311 is otherwise unchanged. Because the change in any fabrication layer of an integrated circuit device usually requires generation and verification of a new mask (or reticle) for that layer, the need to change via layer 311 merely to change the revision number in the device ID may significantly increase the total cost of the revision.

Figure 4:
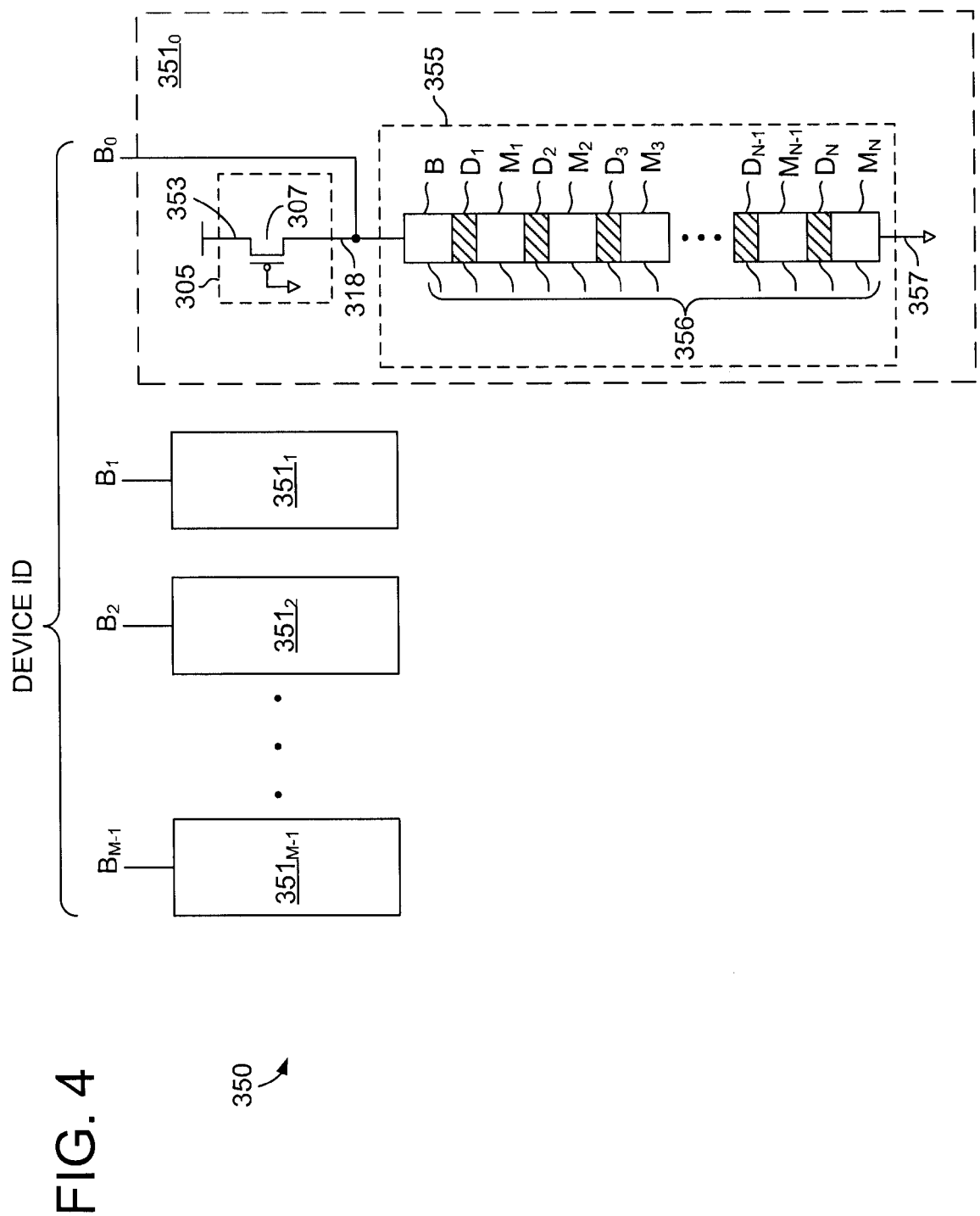
FIG. 4 shows a device identification circuit according to an alternate embodiment.

FIG. 4 illustrates an alternative embodiment of a device ID circuit 350 that may be formed within an integrated circuit device and used instead of or in combination with the device ID circuit 300 of FIG. 3. The device ID circuit 350 includes a number of multi-layer revision (MLR) cells $351_0$-$351_{M-1}$, each having a pull-up circuit 305 coupled to a supply voltage node, and a continuity stack 355 coupled between an output node 318 of the pull-up circuit and a ground node 357. The continuity stack 355 is formed by a series connection of continuity elements 356 each disposed in a respective mask-generated layer of the integrated circuit device 350 and therefore forms a continuous signal path that extends through each device fabrication layer. More specifically, in a fabrication process that yields a base layer (e.g., substrate, one or more diffusions, and poly gates), followed by alternating dielectric and metal layers, the continuity stack includes a base layer continuity element, B, disposed in contact with a continuity element formed in a first dielectric layer, $D_1$ (e.g., a via filled with metal or other conductive material), followed by a continuity element formed in a first metal layer, $M_1$, and so forth through dielectric and metal layers $D_2$, $M_2$ through $D_N$, $M_N$. In the embodiment of FIG. 4, the pull-up circuit 305 is formed by a P-MOS transistor 307 biased to operate as a resistive element. By this arrangement, when a continuity stack 355 is continuous (i.e., forms a continuous signal path between nodes 318 and 357), the drain terminal of the transistor 307 (which forms an output node 318 of the pull-up circuit and an output node of the MLR cell 351) is coupled to ground to generate a logic low MLR cell output. When one or more of the continuity elements 356 are omitted from the continuity stack, the path to ground is interrupted, and the MLR cell output is pulled high by the pull-up circuit 305. By this arrangement, when the mask used to form a given fabrication layer is revised, the continuity element 356 formed in that layer may be removed to interrupt the otherwise continuous signal path between the output node 318 and ground node 357, thereby signaling a design revision. Because the revision is indicated by a modification in the revised fabrication layer itself, otherwise unchanged fabrication layers need not be changed to signal the design revision. Thus, using the MLR cells $351_0$-$351_{M-1}$ to record revision information and other layer-specific identification information may reduce the number of masks that must be regenerated and verified to effect a design revision in the integrated circuit device.

In alternative embodiments, different types of resistive elements may be used to implement the pull-up circuit 305, and pull-down rather than pull-up circuits may be used. For example, in one alternative embodiment, a resistive element is coupled between a ground node and the output node 318 of each MLR cell 351, and the continuity stack 355 is coupled between a supply voltage and the output node 318 of the MLR cell 351, thus producing a high MLR cell output when the continuity stack 355 is continuous and a low MLR cell output when the continuity stack 355 is discontinuous. In other embodiments, the continuity stack 355 may include a plurality of selective-contact parallel connections between the MLR cell output node 318 and a reference voltage node (e.g., supply voltage node or ground node). Also, instead of a single continuity element for the base layer, which may be generated using several different masks, multiple continuity elements that correspond to different base layer masks may be included in the continuity stack 355. Also, while not specifically shown in FIG. 3, each MLR cell 351 may include a buffer circuit (e.g., one or more inverters) coupled between the output node 318 and the MLR cell output.

Figure 5:
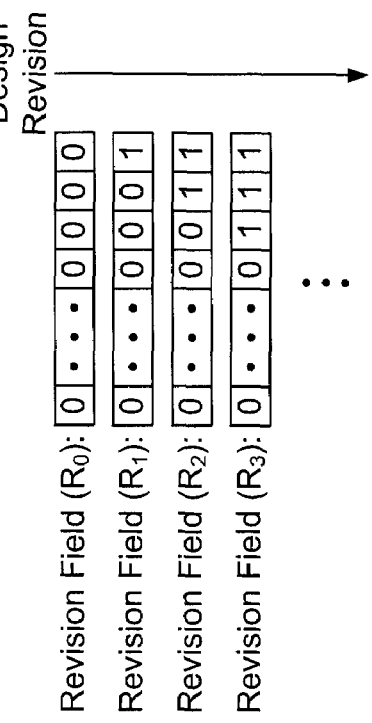
FIG. 5 depicts the manner in which the multi-layer revision cells of FIG. 4 may be used to specify the revision number of a given integrated circuit device.

FIG. 5 illustrates the manner in which the MRL cells $351_0$-$351_{M-1}$ of FIG. 4 may be used to specify the revision number of a given integrated circuit device. The revision number may indicate the number of different mask sets generated for the integrated circuit device (i.e., each mask set being different from another mask set if at least one constituent mask has been revised) or, alternatively, the number of different designs of the integrated circuit device that have been released for production. As discussed above, the MRL cells $351_0$-$351_{M-1}$ may additionally be used to provide other device identification information and may be used in combination with other device ID circuits such as the device ID circuit 300 of FIG. 3.

Referring to FIGS. 4 and 5, in the first, un-revised production of a given integrated circuit device, $R_0$ (Revision 0), the continuity stacks within each of MLR cells $351_0$-$351_{M-1}$ include continuity elements from each device fabrication layer and therefore form continuous signal paths between the pull-up circuit 305 (or pull-down circuit) and the MLR cell output. Thus, the MLR cells $351_0$-$351_{M-1}$ each contribute a logic '0' bit to an M-bit revision field. In a first design revision of the integrated circuit device, $R_1$, one or more continuity elements 356 are removed from the continuity stack of MLR cell $351_0$, thereby flipping the state of the revision field bit contributed by MLR cell $351_0$ from '0' to '1'. For each device revision thereafter, the continuity stack of a different MLR cell 351 is rendered discontinuous (i.e., interrupted by removal of one or more continuity elements) to flip the state of the MLR cell output so that the revision field includes a progressively higher number of logic '1' bits. That is, the revision number is indicated by the number of logic '1' bits; a value referred to herein as decoded revision field. Ultimately, if the integrated circuit device is revised enough times (i.e., M−1 revisions), all the revision field bits are flipped to logic '1' states, rendering the device ID circuit 350 in a fully-consumed condition. By providing a conservative number of MLR cells 351 in proportion to the anticipated number of device revisions, the fully-consumed condition may be avoided.

Figure 6:
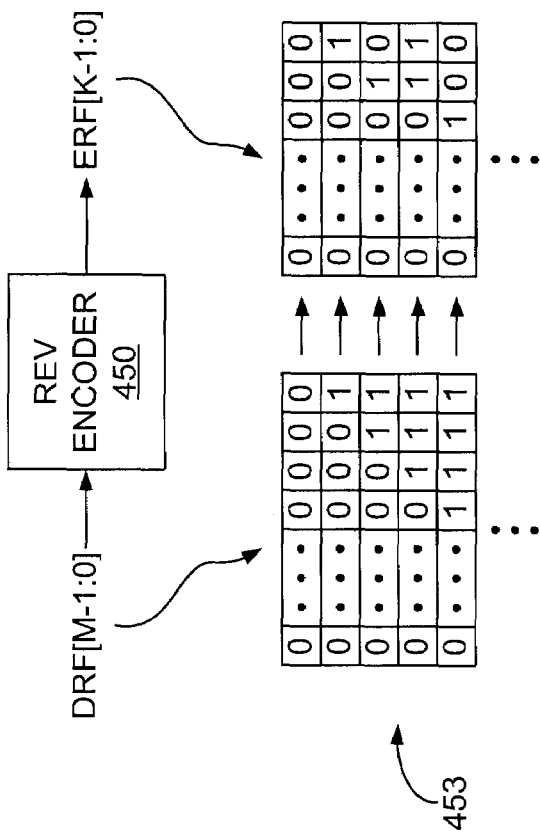
FIG. 6 shows a revision encoder circuit that may be used to convert the decoded revision field of FIG. 5 into an encoded revision field.

FIG. 6 illustrates a revision encoder circuit 450 that may be used to convert the decoded revision field of FIG. 5 into an encoded revision field. That is, the revision field DRF[M−1:0] is encoded as shown at 453 to create an encoded revision field, ERF[K−1:0] where, for example, K=$\log_2$M. As a specific example, a sixteen-bit decoded revision field may be encoded into a four-bit binary-encoded revision field in accordance with the following table:

TABLE 1

| DRF | ERF |
| --- | --- |
| 0000000000000000 | 0000 |
| 0000000000000001 | 0001 |
| 0000000000000011 | 0010 |
| 0000000000000111 | 0011 |
| . | . |
| . | . |
| . | . |
| 1111111111111111 | 1111 |

Other encoding schemes may be used in alternative embodiments.

Figure 7:
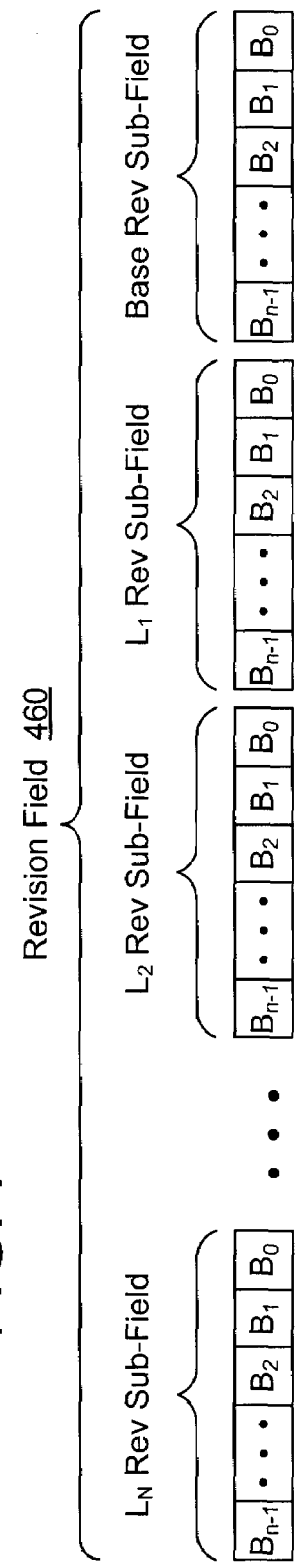
FIG. 7 shows a revision field according to an alternative embodiment.

FIG. 7 illustrates a revision field 460 according to an alternative embodiment. Instead of allocating one MLR cell per overall design revision, multiple MLR cells are allocated to each different fabrication layer, thereby providing an overall revision field having sub-fields that indicate the number of revisions to each fabrication layer. In the particular embodiment shown in FIG. 7, an equal number of MLR cells are allocated to each fabrication layer (e.g., n-bits to a base layer, n-bits to layer L1, n-bits to layer L2, and so forth). In an alternative embodiment, different numbers of MLR cells may be allocated to different fabrication layers in accordance with the number of anticipated revisions in that layer. Also, the base layer may be logically partitioned into different fabrication layers (e.g., according to the number of different masks applied) each having its own revision code. Also, the continuity stack within each MLR cell need only extend to the fabrication layer to which the MLR cell is allocated. For example, the continuity stacks within the MLR cells allocated to the revision sub-field for the metal-1 layer need only extend to the metal-1 layer and coupled at that point to an appropriate voltage node (e.g., ground or supply voltage). Alternatively, each of the continuity stacks may extend through all the fabrication layers, regardless of sub-field allocation.

Figure 8:
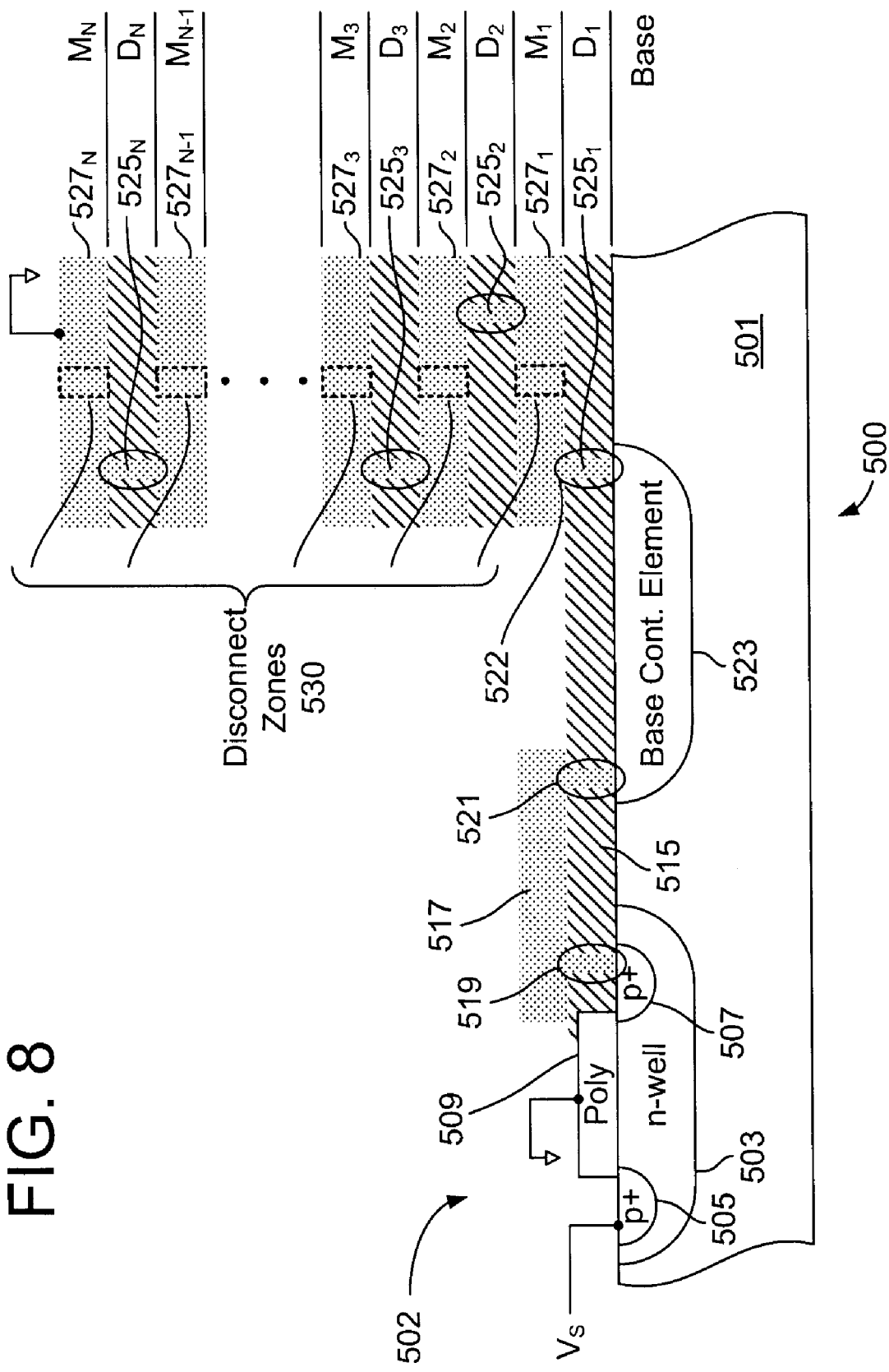
FIG. 8 shows an embodiment of a multi-layer revision cell.

FIG. 8 illustrates an embodiment of a MLR cell 500 formed on a silicon substrate 501 and that corresponds to the MLR cell $351_0$ of FIG. 4. More specifically, the MLR cell 500 includes a P-MOS transistor 502 having a channel disposed in n-well 503, and source and drain terminals 505 and 507, respectively, formed by diffusion of P-type dopant into the n-well 503. A poly gate 509 is formed over the channel and coupled to a bias voltage (ground, in this example) to establish the desired source-to-drain resistance through the P-MOS transistor 502. The source terminal 505 of the transistor 502 is coupled to a supply voltage node, $V_S$, via one or more connectivity structures (not specifically shown) and the drain terminal 507 is coupled to a bridge region 517 of metal layer $M_1$ by way of a via 519 (i.e., an opening) formed in dielectric layer $D_1$. Though not specifically shown, contact material may be formed at the surface of the diffusions that constitute source and drain terminals 505 and 507 to facilitate electrical contact therewith. Also, as discussed above, conductive materials other than metal may be used to form interconnection layers.

In the embodiment of FIG. 8, a low-resistivity dopant (e.g., an n+ dopant) is diffused into the substrate 501 to form a base-layer continuity element 523. The bridge region 517 of $M_1$ is coupled to a first terminal of the base continuity element 523 through via 521, thereby coupling the continuity element 523 to the drain terminal 507 of transistor 502. A second terminal of the base continuity element 523 is coupled to an $M_1$-layer continuity element $527_1$ by way of a via 522 formed in dielectric layer, $D_1$. The via 522 itself, when filled with conductive material (e.g., filled with metal when the $M_1$ layer is formed), establishes a continuity element $525_1$ in dielectric layer $D_1$, the via and conductive fill material being referred to collectively herein as a conductive via. Thus, the continuity element $525_1$ in the $D_1$ layer is coupled to $M_1$ layer continuity element $527_1$ which is coupled, in turn, through a continuity element $525_2$ (i.e., a conductive via) in dielectric layer $D_2$ to a continuity element $527_2$ in metal layer $M_2$. Thus, a stack of continuity elements is formed over the base layer 523 continuity element, extending through each fabrication layer of the integrated circuit device to a final continuity element $527_N$ in metal layer, $M_N$. Continuity element $527_N$ is coupled to a ground node, thus completing the interconnection between the drain terminal 507 of transistor 502 and ground. In the embodiment of FIG. 8, the drain terminal 507 of transistor 502 constitutes the MLR cell output and may be coupled to other circuitry (e.g., buffer circuit and/or one or more pass gates to enable access to the MLR cell output) via bridge region 517.

Still referring to FIG. 8, when the mask or reticle used to generate a metal layer or dielectric layer is altered, the corresponding continuity element for that layer may be omitted or otherwise altered to interrupt the path between the MLR cell output (i.e., at bridge region 517) and ground, thereby signaling the revision. More specifically, in the case of a dielectric layer revision, the via used to form the continuity element for that layer (i.e., $525_1, 525_2, 525_3, \ldots, 525_N$) may be omitted, thereby decoupling (electrically isolating from one another) the continuity elements in the layers above and below the dielectric layer to interrupt the path to ground. In the case of a metal layer, metal (or other conductive material) may be omitted from a disconnect zone 530 in the corresponding continuity element (i.e., $527_1, 527_2, 527_3, \ldots, 527_N$) as shown in FIG. 8. In one embodiment, each of the disconnect zones 530 is disposed within a metal layer continuity element 527 between two dielectric layer continuity elements 525 so that, when conductive material is omitted from the disconnect zone, the conductive path between the two dielectric layer continuity elements 525 is interrupted, thereby rendering the complete continuity stack discontinuous. In the case of a revision to one or more of the base layer masks (i.e., the masks used to generate the various diffusion regions 503, 505, 507, 523 and poly gate 509), the mask or masks may also be revised to omit the continuity element 523, thereby interrupting the path to ground and signaling the revision. In alternative embodiments, multiple base-layer continuity elements may be provided (e.g., one for each base layer mask) instead of the single continuity element 523.

Still referring to FIG. 8, in alternative embodiments, the disconnect zones 530 disposed within the metal layer continuity elements 527 may be disposed directly above and/or beneath continuity elements 525 that are in the surrounding dielectric layers. Also, as discussed above in reference to FIG. 3, a pull-down circuit may be used in place of the pull-up effected by transistor 502 and the top-of-stack continuity element (i.e., continuity element $527_N$ in the embodiment of FIG. 8) coupled to a logic high voltage instead of ground. Also, the continuity stack for one or more MLR cells may extend only to intermediate layers of the integrated circuit device, as discussed in reference to FIG. 7. Further, while the MLR cell 500 has been described in reference to a silicon substrate and corresponding fabrication process, other substrate types (e.g., gallium arsenide, germanium, silicon germanium, etc.) and fabrication processes may be used in alternative embodiments.

Figure 9:
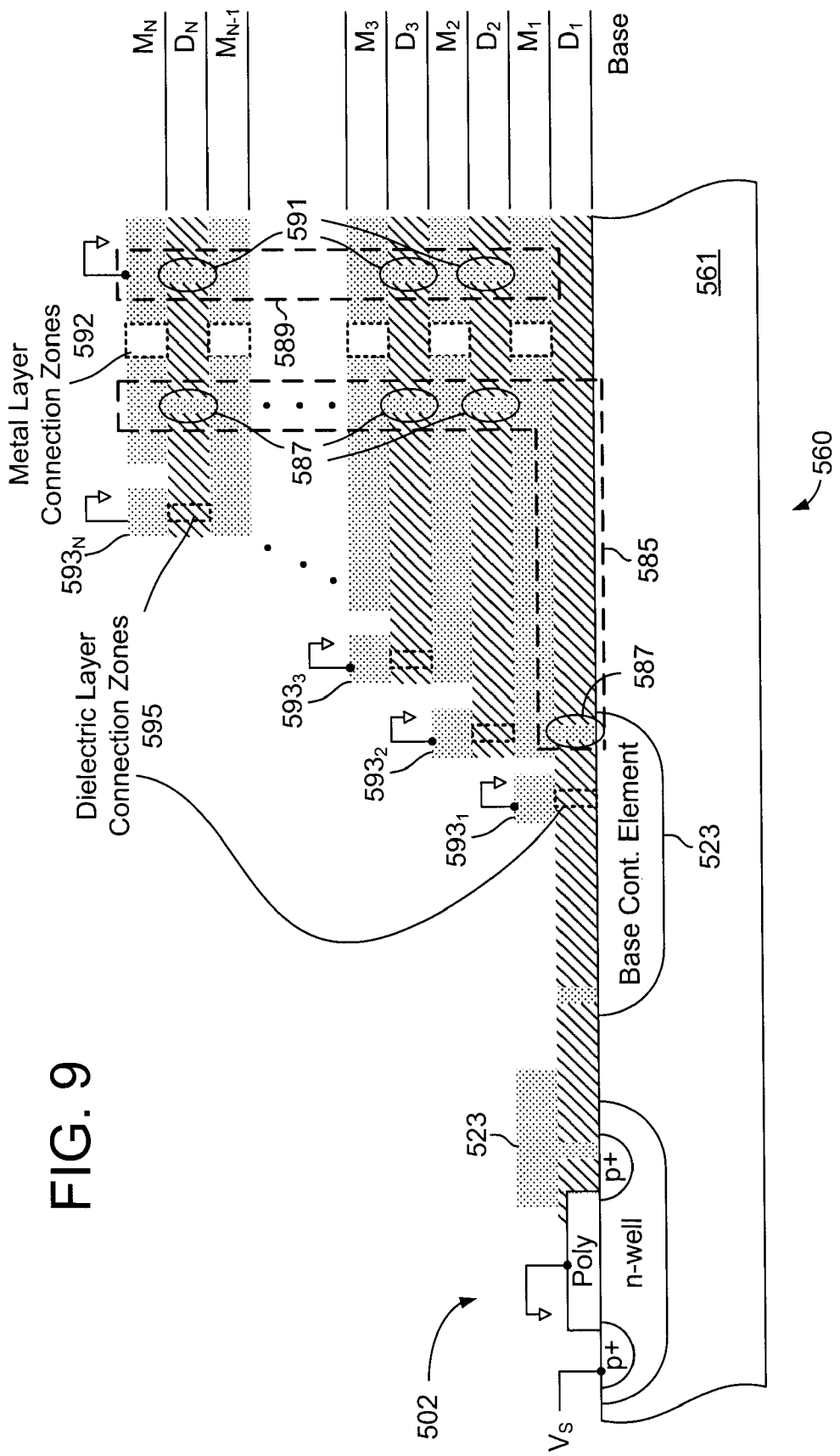
FIG. 9 shows an alternative embodiment of a multi-layer revision cell.

FIG. 9 illustrates an alternate embodiment of an MLR cell 560 formed on a silicon substrate 561. In contrast to the MLR cell 500 of FIG. 8, in which a continuous signal path between a pull-up circuit and ground is selectively interrupted, the MLR cell 560 includes a plurality of parallel paths between a pull-up circuit and ground which may be selectively formed to signal revision and other device identification information. In the particular embodiment shown, the MLR cell 560 includes the transistor 502, $M_1$-layer bridge region 517 and base continuity element 523, each connected to one another as described in reference to FIG. 8. The base continuity element 523 is additionally coupled to a first continuity stack 585 that extends through conductive vias 587 to each metal layer, $M_1$-$M_N$. In contrast to the continuity stack of FIG. 8, however, the final metal layer, $M_N$, in the continuity stack 585 is not coupled to a reference voltage node. Rather the entire continuity stack 585 is, when in an unrevised form, pulled to a logic high state by the operation of the transistor 502. A second, partial continuity stack 589, extends from the $M_1$ layer through conductive vias 591 to each of the other metal layers and is coupled to ground (e.g., by virtue of a ground connection at the $M_N$ layer, or any other of the $M_1$-$M_N$ layers). The continuity stacks 585 and 589 are separated from one another in each metal layer by a region referred to herein as a metal layer connection zone 592. Thus, if a revision is made to a given metal layer, the revision may be signaled by forming a continuous metal region that bridges the metal layer connection zone 592 for the revised layer, thus joining the continuity stacks 585 and 589 and providing a path to ground to pull-down the MLR cell output.

Still referring to FIG. 9, additional, ground-coupled metal regions $593_1, 593_2, 593_3, \ldots, 593_N$ are formed in metal layers $M_1$-$M_N$. As shown, dielectric layer connection zones 595 are located in each dielectric layer beneath a respective one of the regions $593_1$-$593_N$ and over a portion of the lower-level metal layer (or over base layer continuity element 523) that forms the continuity stack 585. By this arrangement, if a given dielectric layer is revised, a conductive via may be formed in the corresponding connection zone 595 to ground the continuity stack 585, thereby flipping the output state of the MLR cell and signaling the revision. Though not visible in the profile view of FIG. 9, an additional conductive via is disposed in dielectric layer $D_1$ adjacent a connection zone for the base continuity element 523 and coupled to region $593_1$. If the base layer is revised, the footprint of the base continuity element 523 may be extended to contact the conductive via, thereby pulling down the MLR cell output to signal the base layer revision. In alternative embodiments, multiple base-layer continuity elements may be provided (e.g., one for each base layer mask) instead of the single continuity element 523.

As in the embodiment of FIG. 8, a pull-down circuit may be used in place of the pull-up effected by transistor 502, and the continuity stack 585 and metal regions $593_1$-$593_N$ coupled to a logic high voltage (e.g., a supply voltage) instead of ground. Also, the continuity stacks 585 and 589 for one or more MLR cells may extend only to intermediate layers of the integrated circuit device, as discussed in reference to FIG. 7. Further, while the MLR cell 560 has been described in reference to a silicon substrate and corresponding fabrication process, other substrate types (e.g., gallium arsenide, germanium, silicon germanium, etc.) and fabrication processes may be used in alternative embodiments.

As described above, the multi-layer revision (MLR) cells 351 of FIG. 4 allow a device ID electronically stored within an IC device to be read by an external device or system, for example, so that the external device may determine the revision number of the IC device from information contained in the device ID. More specifically, each MLR cell 351 includes a pull-up circuit 305 and a continuity stack 355 coupled between VDD and ground potential, where the continuity stack 355 is formed by a series connection of continuity elements 356 each disposed in a respective mask-generated layer of the IC device such that the continuity stack forms a continuous signal path that extends through each device fabrication layer. When a given device layer is revised, the continuity element 356 formed in the revised device layer can be removed to interrupt the continuous signal path between VDD and ground potential, thereby allowing the pull-up circuit to pull the output signal high (e.g., towards VDD) to indicate a device revision. Thus, by allowing a revision to be signaled by a modification in the revised layer itself, the embodiments described above with respect to FIG. 4 advantageously avoid the need to revise otherwise unchanged layers to signal device revisions.

Although allowing a device revision number to be updated by making changes only in the device layer that results in the revision, the MLR cells 351 of FIG. 4 undesirably consume static DC power. For example, in its original state (e.g., in which the signal path provided by continuity stack 355 is continuous through the various mask-generated layers of the IC device), each MLR cell 351 conducts a static DC current from the supply voltage to ground potential through pull-up transistor 305 and continuity stack 355, thereby resulting in undesirable power and heat dissipation.

Further, the number of different revision numbers generated by MLR cells 351 of FIG. 4 is undesirably limited to the number of MLR cells 351 provided in the IC device. For example, after a device revision, the continuity stack 355 within a corresponding MLR cell 351 is rendered discontinuous to flip the logic state of the corresponding bit of the revision number from its initial logic 0 state to a logic 1 state. Thus, once the logic state of any bit of the revision number is changed from logic 0 to logic 1, it can be changed back to logic 0 only by subsequently revising the same device layer that was previously revised, which could undesirably result in revising multiple device layers merely to update the revision number. As a result, the revision number provided by MLR cells 351 is a decoded signal in which the number of revisions is indicated by the number of logic 1 bits generated by the MLR cells 351. Accordingly, prior to device fabrication, a manufacturer must precisely predict the number of future revisions to the device and provide a corresponding number of MLR cells 351 in the device ID circuit, which is not desirable. For example, providing too few MLR cells 351 undesirably limits the number of revisions that may be indicated in the revision number, and providing too many MLR cells 351 undesirably increases the static power consumption of the device ID circuit.

Thus, in accordance with additional embodiments of the present invention, a device ID circuit is disclosed that not only allows revisions to be indicated by modifications solely to the revised layers but that also does not consume static DC power. Further, for some of the additional embodiments, the device ID circuit generates a revision code having a number of possible values that is exponentially related to the number of MLR cells employed. More specifically, for some embodiments, the device ID circuit includes an encoder circuit that allows a revision code having M bits to represent $P=2^M$ different revision numbers, as compared to only M different revisions that can be indicated by an M-bit revision number generated by the device ID circuits described above with respect to FIGS. 3-9. The ability of these additional embodiments to double the number of possible revision numbers with the addition of each bit to the revision code diminishes the need for device manufacturers to precisely predict the number of possible device revisions prior to manufacture.

In addition, for some embodiments, the revision code generated by the device ID circuit is arbitrary so that the revision codes may be assigned to device revisions in any order (e.g., non-sequential revision codes may be assigned to sequential device revisions). More specifically, the device ID circuit can include a plurality of MLR group structures, where each MLR group structure includes a number of MLR cells providing a number of output bits that are logically combined to generate a corresponding bit of the revision code. Within each MLR group structure, the MLR cells can be assigned to different device layers so that the logic state of the corresponding bit of the revision code is controllable by any of the MLR cells in the MLR group structure. In this manner, revisions to any one device layer can force the revision code to any desired value, as explained in more detail below.

Figure 10:
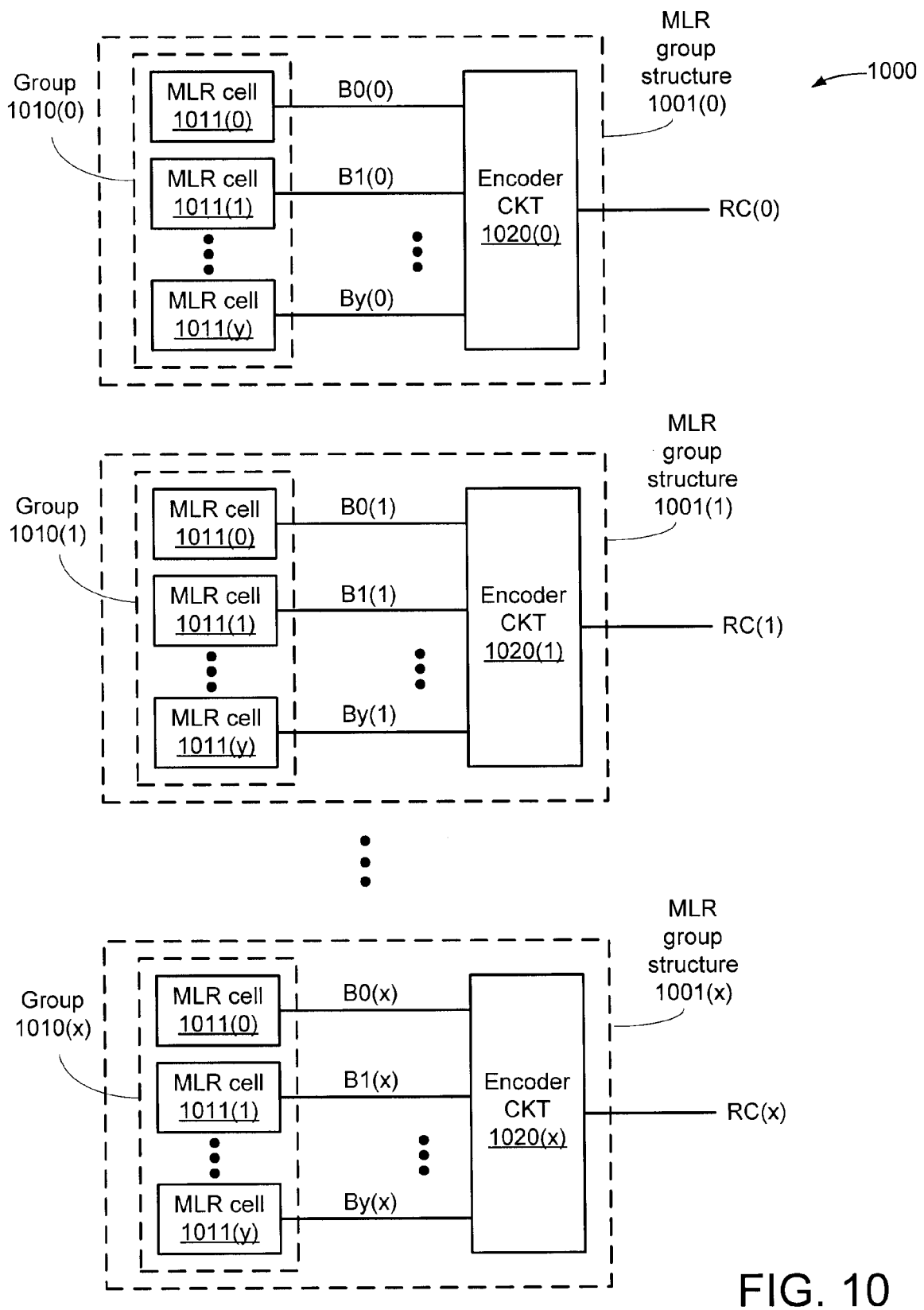
FIG. 10 is a block diagram of a device ID circuit in accordance with other embodiments of the present invention.

FIG. 10 shows a device ID circuit 1000 in accordance with some additional embodiments of the present invention. Device ID circuit 1000 may be implemented in any suitable semiconductor device such as, for example, IC device 100 of FIG. 1. Thus, for some embodiments, device ID circuit 1000 is another embodiment of device ID circuit 107 of FIG. 1, which can be implemented in any suitable IC device including, but not limited to, CAM devices, volatile memory devices (e.g., RAM), non-volatile memory devices (PROM, EEPROM, flash memory), programmable logic devices (PLDs), microprocessors, analog circuitry, and so on. Further, although device ID circuit 1000 is described below in the context of generating a revision code RC, it is to be understood that device ID circuit 1000 can generate a device ID code that indicates the device type, manufacturing information (e.g., date, location, lot number, process-type, name of manufacturer etc.), tolerance information, or any other information that may be used to identify or characterize the IC device within which device ID circuit 1000 is formed.

As shown in FIG. 10, device ID circuit 1000 includes a plurality of MLR group structures 1001(0)-1001($x$). Each MLR group structure 1001 includes a group 1010 of MLR cells 1011(0)-1011($y$) coupled to the inputs of a corresponding encoder circuit 1020. More specifically, the MLR cells 1011(0)-1011($y$) within each MLR group structure 1001 provide respective bits B0-B$y$ to the structure's encoder circuit 1020, which logically combines the B0-B$y$ to generate a corresponding bit of the revision code. For example, MLR group structure 1001(0) includes a group 1010(0) of MLR cells 1011(0)-1011($y$) that provide respective bits B0(0)-B0($y$) to encoder circuit 1020(0), which logically combines bits B0(0)-B0($y$) to generate RC(0). The revision code RC generated by device ID circuit 1000 can be provided to other circuitry in any suitable manner. For example, for some embodiments, the revision code bits RC(0)-RC(x) generated by MLR group structures 1001(0)-1001($x$) may be provided to a data bus by corresponding pass transistors, as depicted in FIG. 3. For other embodiments, the device ID embodied by RC(0)-RC(x) may be provided to another suitable bus or storage circuit (not shown for simplicity) that can be accessed by other circuitry on the host IC device and/or by an external device or system. For still other embodiments, encoder circuits 1020 may be eliminated, and each group of MLR cells 1011(0)-1011($y$) may provide a respective set of bits B0-B$y$ to a data bus (e.g., such as data bus 301 of FIG. 3).

Each MLR cell 1011 is configurable to drive its corresponding output bit B to either a logic 1 or logic 0 state without consuming static DC power, thereby significantly reducing the static power consumption and heat dissipation of device ID circuit 1000, for example, as compared to device ID circuit 300 of FIG. 3. For some embodiments, each MLR cell 1011 is selectably configured to pull its output to either the supply voltage VDD (e.g., to logic 1) or to ground potential (e.g., to logic 0), and the cell outputs are connected to the encoder circuits 1020 in a manner that does not create a DC current path between VDD and ground potential, as described in more detail below.

For example, for some embodiments, each encoder circuit 1020 is a combinational logic circuit implemented by one or more hierarchical levels of logic gates such as NAND, NOR, and/or XOR gates, and the outputs of each MLR cell 1011 within a corresponding cell group 1010 are coupled to the gates of CMOS transistors (not shown for simplicity) that implement the logic gates of the encoder circuit 1020. Because the current flow through the gate of a CMOS transistor is negligible, there is no static DC current flow between encoder circuit 1020 and MLR cells 1011 during normal operation of device ID circuit 1000, and therefore the device ID circuit 1000 does not consume static DC power.

Figure 11:
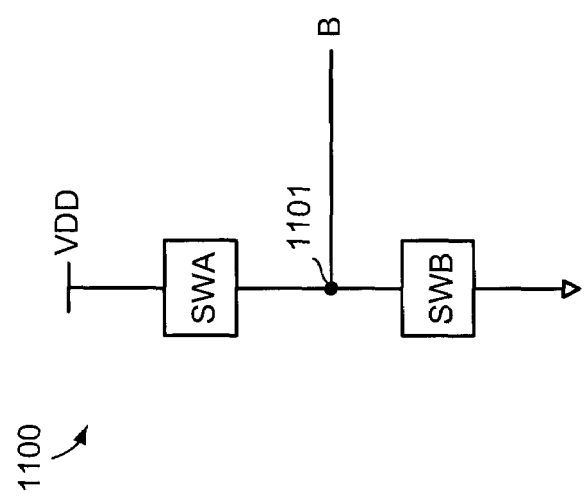
FIG. 11 is a functional block diagram of one embodiment of an MLR cell of the device ID circuit of FIG. 10.

As mentioned above, each MLR cell 1011 is configurable to drive its corresponding output bit B to either a logic 1 or logic 0 state without consuming static DC power. For example, FIG. 11 shows a simplified functional block diagram of an MLR cell 1100 that is one embodiment of MLR cell 1011 of FIG. 10. MLR cell 1100 includes a first switching element SWA, a second switching element SWB, and an output node 1101 to provide output bit B to an input of encoder circuit 1020. SWA is coupled between a supply voltage VDD and output node 1101, and SWB is coupled between ground potential and output node 1101. MLR cell 1100 is fabricated with one switching element in a conducting state and the other switching element in a non-conducting state.

For example, to configure MLR cell 1100 in a first state, SWA is conductive and pulls output node 1101 high towards VDD and SWB is non-conductive to isolate node 1101 from ground potential, thereby generating a logic "1" output signal B. Conversely, to configure MLR cell 1100 in a second state, SWB is conductive and pulls output node low towards ground potential and SWA is non-conductive to isolate node 1101 from VDD, thereby generating a logic "0" output signal B. Because one of switching elements SWA or SWB is non-conductive in either configuration of MLR cell 1100, there is not a DC current path between VDD and ground potential through MLR cell 1100. This is in contrast to MLR cells 351 of FIG. 4, which undesirably consume DC power during normal operation.

The switching elements SWA and SWB of MLR cell 1100 may be any suitable circuit, device, or structure that can be selectively configured to operate as either a conductive element or a non-conductive element. For example, switching elements SWA-SWB can be implemented using one-time programmable circuitry such as a non-volatile storage elements or fused circuits, or alternatively can be implemented using programmable non-volatile circuitry such as PLD's, SRAM, DRAM, and the like.

Figure 12:
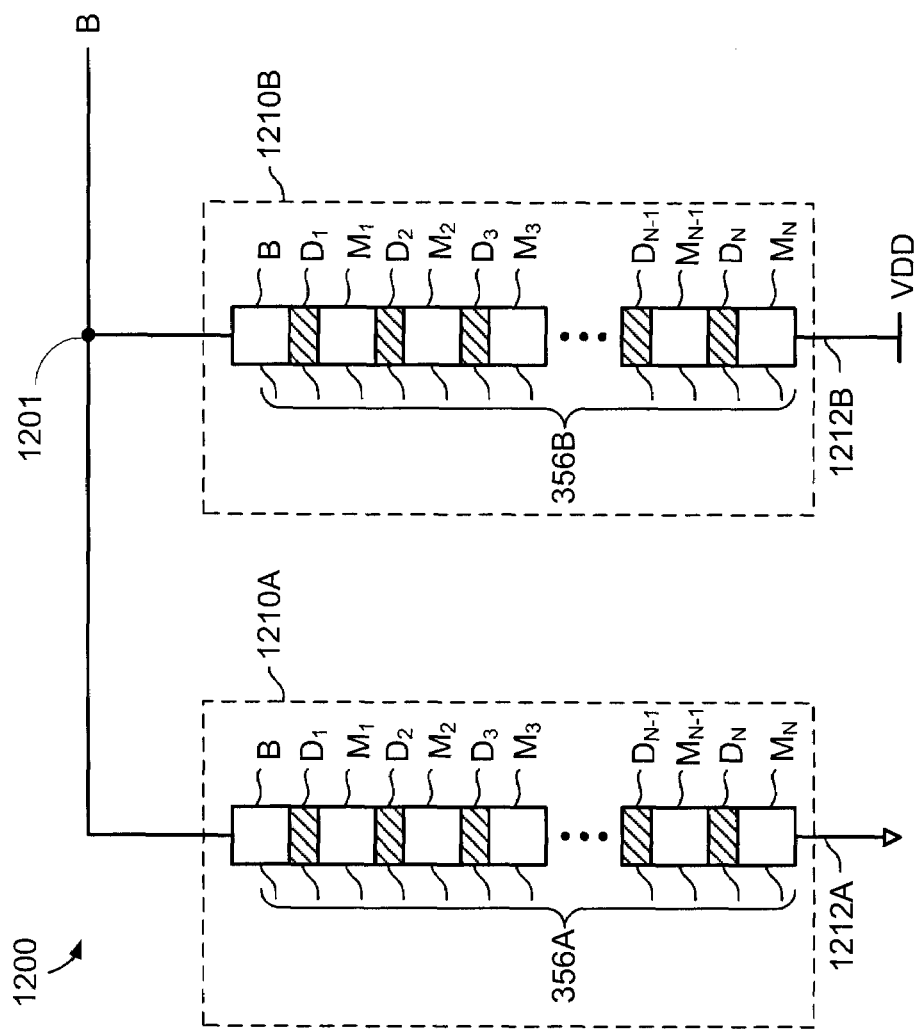
FIG. 12 is a block diagram of one embodiment of the MLR cell of FIG. 11.

For some embodiments, switching elements SWA-SWB can be implemented using continuity stacks similar to the continuity stacks 356 described above with respect to FIG. 4. For example, FIG. 12 shows an MLR cell 1200 that is another embodiment of MLR cell 1011 of FIG. 10. MLR cell 1200 includes a pair of parallel-connected continuity stacks 1210A and 1210B, with continuity stack 1210A coupled between cell output node 1201 and ground potential at contact 1212A and continuity stack 1210B coupled between cell output node 1201 and VDD at contact 1212B. Each continuity stack 1210 is formed by a series connection of continuity elements 356 each disposed in a respective mask-generated layer of the IC device and therefore forms a continuous signal path that extends through each device fabrication layer. More specifically, in a fabrication process that yields a base layer (e.g., substrate, one or more diffusions, and poly gates), followed by alternating dielectric and metal layers, the continuity stack includes a base layer continuity element, B, disposed in contact with a continuity element formed in a first dielectric layer, $D_1$ (e.g., a via filled with metal or other conductive material), followed by a continuity element formed in a first metal layer, $M_1$, and so forth through dielectric and metal layers $D_2$, $M_2$ through $D_N$, $M_N$. For some embodiments, the CMOS transistors (not shown for simplicity) that implement encoder circuit 1020 are formed in the base layer of the IC device, with the gates of the CMOS transistors formed in the poly layer of the base layer and coupled to the MLR cell output 1201. Also, for some embodiments, contacts 1212A and 1212B, which provide electrical connections to ground potential and VDD, respectively, are formed in the top device layer, which is depicted in FIG. 12 as metal layer $M_N$. For other embodiments, the top device layer may be a layer other than a metal layer, for example, such as a dielectric layer. For still other embodiments, the contacts 1212A and/or 1212B may be formed in any suitable device layer, in which case the first and second continuity stacks 1210A-1210B need only extend from the base layer to the device layer that contains the supply voltage contacts 1212A-1212B. Further, for such embodiments, the contacts 121A-1212B may be coupled to ground potential and VDD, respectively, by well-known tie cells (not shown for simplicity).

The MLR cell 1200 can be configured in either a first state or a second state to selectively output a logic 1 value or a logic 0 value, respectively, by fabricating one of continuity stacks 1210A-1210B to be a conductive element and fabricating the other of continuity stacks 1210A-1210B to be a non-conductive element. For example, to configure MLR cell 1200 in the first state, continuity stack 1210B is configured to form a continuous signal path between output node 1201 and VDD (e.g., thereby pulling B high toward VDD), and continuity stack 1210A is configured as a non-conductive element by omitting one or more of the continuity elements 356 from continuity stack 1210A to isolate output node 1201 from ground potential. Conversely, to configure MLR cell 1200 in the second state, continuity stack 1210A is configured to form a continuous signal path between output node 1201 and ground potential (e.g., thereby pulling B low toward ground potential), and continuity stack 1210B is configured as a non-conductive element by omitting one or more of the continuity elements 356 from continuity stack 1210B to isolate output node 1201 from VDD.

By this arrangement, when the mask used to form a given fabrication layer is revised, the conductive states of the continuity elements 356A-356B formed in that layer may be altered (e.g., reversed) to change or flip the logic state of the corresponding output bit B provided by the MLR cell 1200, thereby signaling a design revision. Because the revision is indicated by a modification in the revised fabrication layer itself, otherwise unchanged fabrication layers need not be changed to signal the design revision. Thus, using the MLR cells 1200 to record revision information and other layer-specific identification information may reduce the number of masks that must be regenerated and verified to effect a design revision in the integrated circuit device.

For other embodiments, instead of a single continuity element for the base layer, which may be generated using several different masks, multiple continuity elements that correspond to different base layer masks may be included in the continuity stacks 1210A-1210B. Also, while not specifically shown in FIG. 12, each MLR cell 1200 may include a buffer circuit (e.g., one or more inverters) coupled to the output node 1201. Further, the MLR cells of FIGS. 10, 11, and 12 are described above as being coupled to VDD and ground potential. For other embodiments, the MLR cells may be coupled to other reference voltages capable of driving the CMOS transistors that implement combinational logic functions of encoder circuit 1020 to conductive and non-conductive states.

Figure 13:
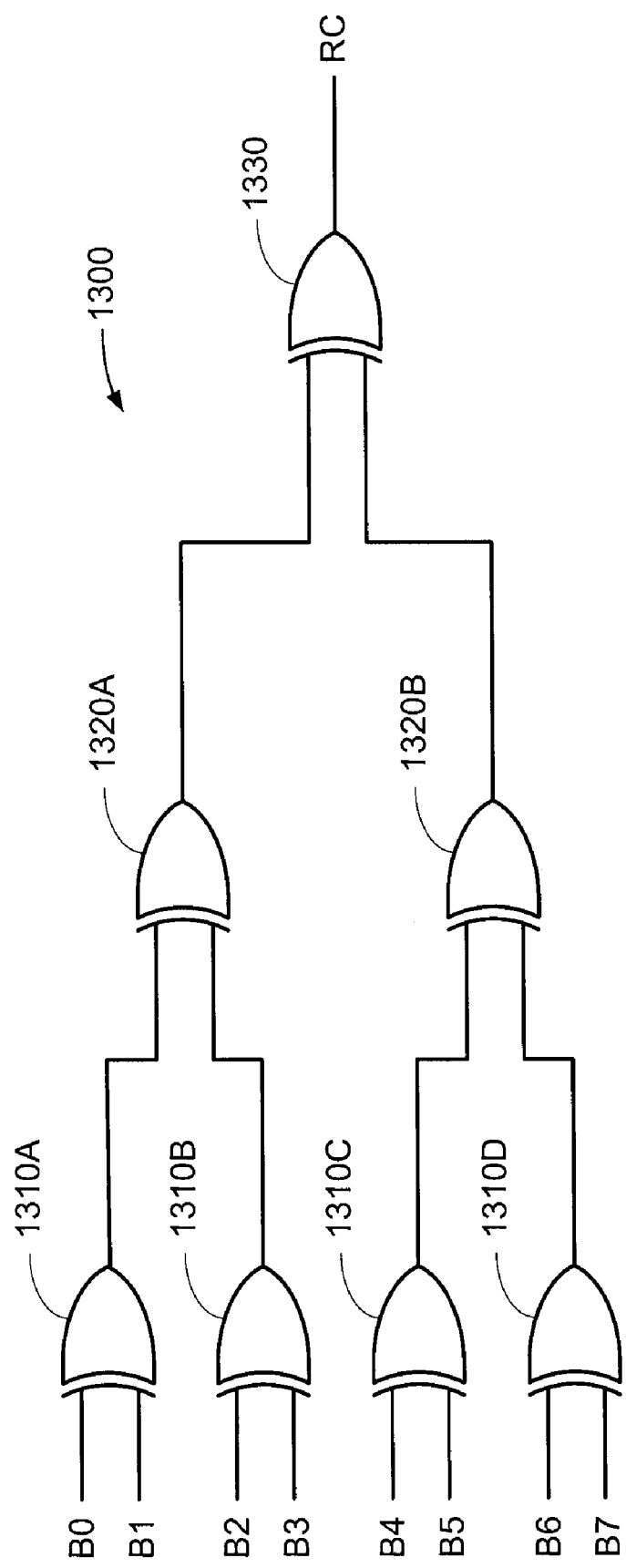
FIG. 13 is a schematic diagram of one embodiment of the encoder circuit of FIG. 10.

Referring again to FIG. 10, the encoder circuits 1020(0)-1020(x) of device ID circuit 1000 can be combinational logic circuits that implement various logic functions such as NAND, NOR, and XOR to generate the RC bits as logical combinations of signals B provided by MLR cell groups 1010, as mentioned above. For some embodiments, each encoder circuit 1020 is a bit parity circuit that performs an XOR function on its input signals B0-By to generate the corresponding RC bit of the revision code. For example, FIG. 13 shows a parity circuit 1300 that is an exemplary embodiment of encoder circuit 1020 of FIG. 10. The exemplary parity circuit 1300 of FIG. 13 includes 8 inputs to receive 8 signals B0-B7 from a group of 8 MLR cells 1011(0)-1011(7) (not shown in FIG. 13 for simplicity), and includes $\log_2 8 = 3$ hierarchical levels of 2-input XOR gates 1310, 1320, and 1330 that generate a revision code bit RC as the logical XOR function of input signals B0-B7.

Although shown in FIG. 13 as configured to receive 8 input signals B0-B7, for other embodiments, the parity circuit 1300 can be configured to receive greater or fewer numbers of input signals by adding more XOR gates or omitting some existing XOR gates, respectively, as known in the art. Further, for embodiments in which an odd number of input signals are provided to embodiments of parity circuit 1300, the XOR gate input that does not receive an input signal B from an MLR cell can be connected to ground potential (e.g., hardwired to logic 0) or connected to VDD (e.g., hardwired to logic 1). Of course, for other embodiments, other parity circuits or circuits implementing other logical functions may be employed as encoder circuits 1020.

Figure 14:
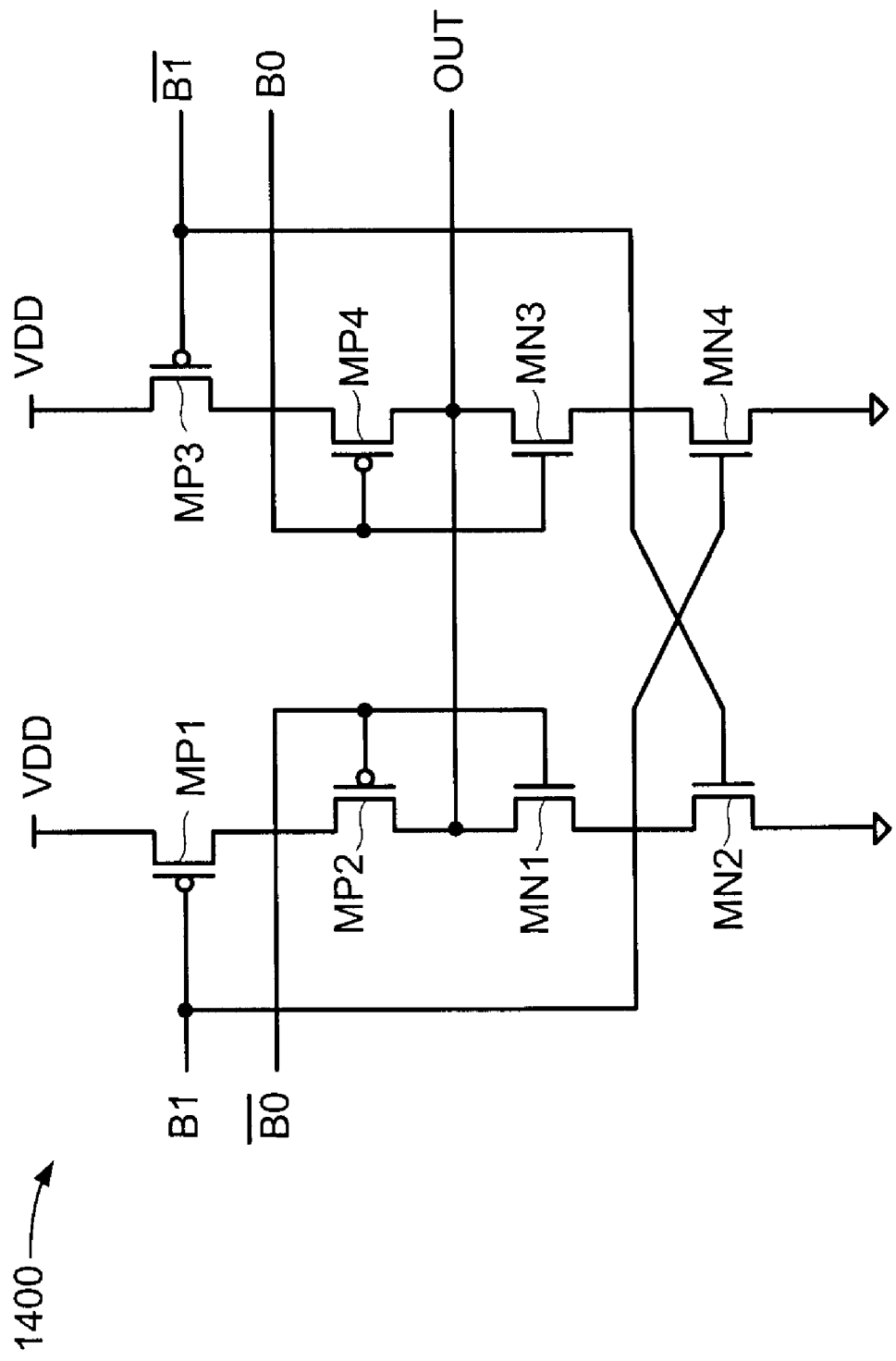
FIG. 14 is a schematic diagram of one embodiment of an XOR gate of FIG. 13.

FIG. 14 shows a well-known XOR logic gate 1400 that is one embodiment of XOR gates 1310, 1320, and 1330 that form encoder circuit 1300 of FIG. 13. XOR gate 1400 is shown to provide an output bit OUT that is the logical XOR combination of input signals B0 and B1, where $\overline{B0}$ and $\overline{B1}$ are logical complements of B0 and B1, respectively. As shown in FIG. 14, input signals B0 and B1 are provided as control voltages to gates of various CMOS transistors MP1-MP4 and MN1-MN4 that implement XOR gate 1400, and therefore there is no static DC current flow between the MLR cells and the encoder circuits of embodiments of device ID circuit 1000.

Referring again to FIG. 13, during operation of the device ID circuit 1000, parity circuit 1300 drives RC to logic 0 if an even number (including zero) of signals B0-B7 are logic 1, and drives RC to logic 1 if an odd number of signals B0-B7 are logic 1 (e.g., the logic state of RC indicates whether an even number or odd number of MLR cell output signals B(0)-B(7) are logic 1). Thus, a change in the logic state of any one of signals B0-B7 provided by any one of corresponding MLR cells 1011(0)-1011(7) can change (e.g., toggle) the logic state of the output code bit RC. Of course, for other embodiments, another parity circuit can be used that drives RC to logic 1 if an even number (including zero) of signals B0-B7 are logic 1, and drives RC to logic 0 if an odd number of signals B0-B7 are logic 1.

More specifically, referring also to FIG. 12, because the logic state of the MLR cell output signal can be controlled by altering the pair of continuity elements 356A-356B formed in any of the device layers (e.g., base layer B, dielectric layers $D_1$-$D_N$, and metal layers $M_1$-$M_N$), and because the RC bit generated by each MLR group structure can be controlled by any one of its MLR cells, the assignment of one MLR cell 1011 in every MLR group structure 1001(0)-1001(x) to a particular device layer such that only the cell's continuity elements 356 that reside within the particular assigned device layer may be altered to toggle the cell's output signal allows a change in any one device layer to drive the revision code RC[x:0] to any possible value. For example, if the first MLR cell 1011(0) in each MLR group structure 1001 is assigned to device layer $D_1$, then during revision of layer $D_1$, the conductivities of the continuity elements 356A-356B residing in layer $D_1$ of a selected number of MLR cells 1011(0) can be reversed to toggle a corresponding number of the RC bits. As a result, changes in a single device layer can result in the generation of any desired revision code, irrespective of the continuity stack configurations of MLR cells 1011 that are assigned to other device layers. In this manner, the revision codes are arbitrary in that they are not dependent upon by the number or sequence of device revisions.

The ability of device ID circuit 1000 to generate an arbitrary revision code is advantageous. First, unlike device ID circuit 300, which achieves a fully-consumed condition when all the revision bits have been asserted to logic "1" and would require altering every previously-revised device layer to reset the revision number back to its initial state of all "0's," device ID circuit 1000 can easily implement a rollover feature for its revision code, for example, by selectively altering the continuity element pairs 356A-356B in a single device layer to reset the revision code to its initial value (e.g., all logic "0's"). Second, unlike device ID circuit 300, which generates a revision number that follows a predetermined numerical sequence (e.g., for each revision, an additional MLR cell 351 is rendered discontinuous so that the decoded revision number includes an increasing number of "1's"), device ID circuit 1000 generates a revision code RC[x:0] whose value may be changed in a non-sequential manner in response to a sequence of revisions.

Referring again to FIG. 10, because device ID circuit 1000 generates an encoded revision code, the number of possible revision codes is exponentially related to the number of MLR group structures 1001. More specifically, a device ID circuit 1000 that includes a number Z of MLR group structures 1001 generates a Z-bit revision code, which in turn has $P=2^Z$ possible values. In contrast, because device ID circuit 300 of FIG. 3 generates a decoded revision number, the number of possible revision numbers generated by device ID circuit 300 is equal to the number of MLR cells 351. Thus, while the addition of each MLR cell to the device ID circuit 300 increases the number of possible revision numbers by 1, the addition of each MLR group structure to device ID circuit 1000 doubles the number of possible revision codes. For example, while device ID circuit 300 requires 64 MLR cells 351 to provide 64 different revision numbers, device ID circuit 1000 requires only $\log_2 64=6$ MLR group structures 1001 to provide 64 different revision numbers.

An exemplary operation for initializing an embodiment of device ID circuit 1000 to generate an initial predetermined revision code and for subsequently re-configuring the device ID circuit to generate new revision codes reflecting subsequent revisions of the IC device is described below with respect to the exemplary device ID circuit 1500 of FIG. 15 and the illustrative flow chart of FIG. 16. Device ID circuit 1500, which is an exemplary embodiment of device ID circuit 1000 of FIG. 10, is shown to include 2 MLR group structures 1001(0)-1001(1) that generate a 2-bit revision code RC[1:0] that is capable of indicating up to $2^2=4$ device revisions. Of course, for other embodiments, device ID circuit 1500 may include any number Z of MLR group structures 1001 to generate a revision code Z bits and thus capable of indicating $P=2^Z$ device revisions.

Figure 15:
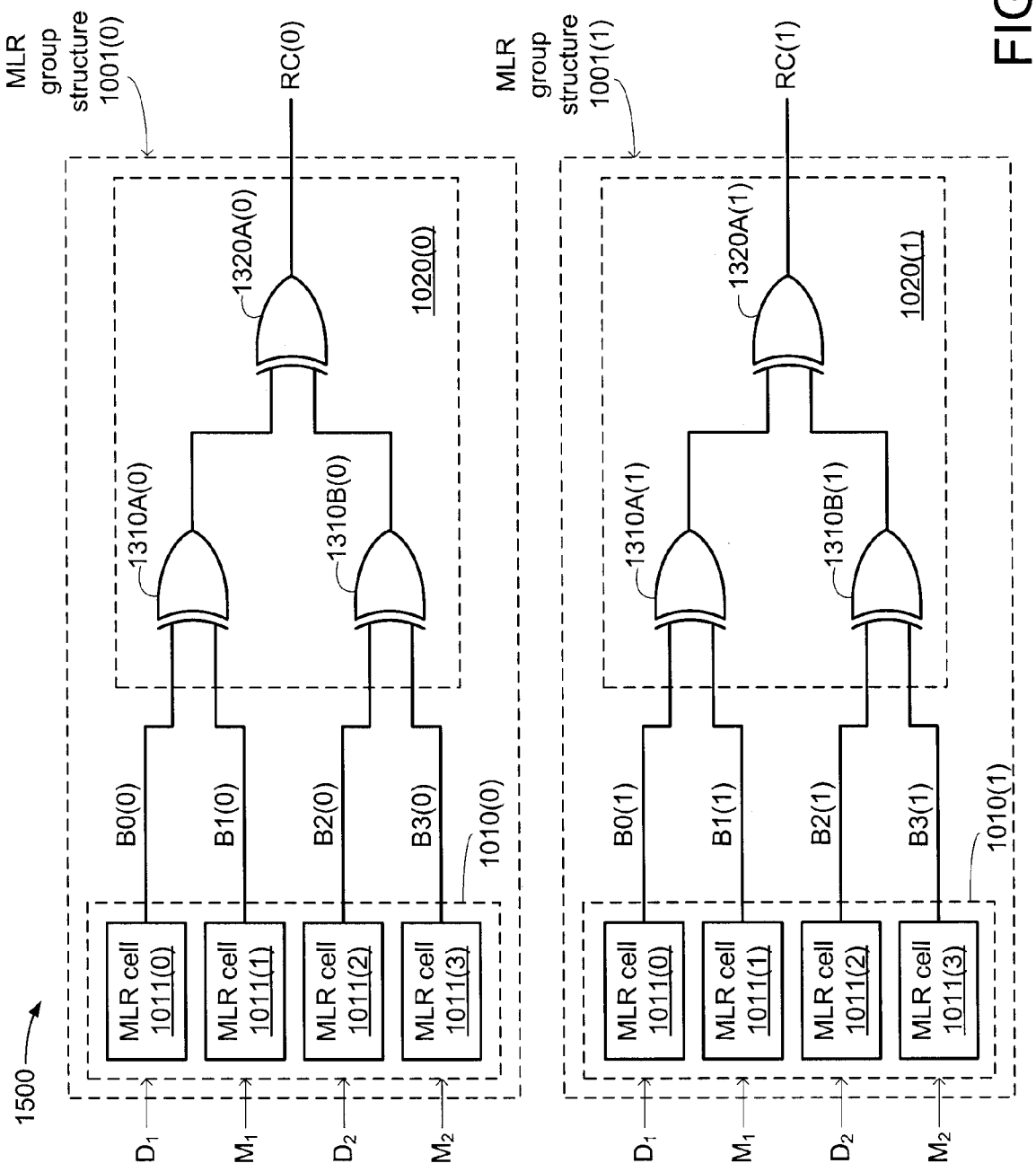
FIG. 15 is a block diagram of an exemplary embodiment of the device ID circuit of FIG. 10.

For the exemplary embodiment of FIG. 15, each MLR group structure 1001 is shown to include four MLR cells 1011(0)-1011(3) coupled to a corresponding encoder circuit 1020, which is a parity circuit formed by 2 hierarchical levels of 2-input XOR gates 1310 and 1320. More specifically, encoder circuit 1020(0) generates a first revision code bit RC(0) that indicates the parity of signals B0-B3 provided by MLR cells 1011 of first MLR cell group 1010(0), and encoder circuit 1020(1) generates a second revision code bit RC(1) that indicates the parity of signals B0-B3 provided by MLR cells 1011 of second MLR cell group 1010(1). Thus, because each MLR group structure 1001 of FIG. 15 includes 4 MLR cells 1011, up to 4 layers of an IC device may contribute to revision code updates. Of course, for other embodiments, each MLR group structure 1001 may include any number Y of MLR cells 1011 to allow up to Y device layers to contribute to revision code updates.

Figure 16:
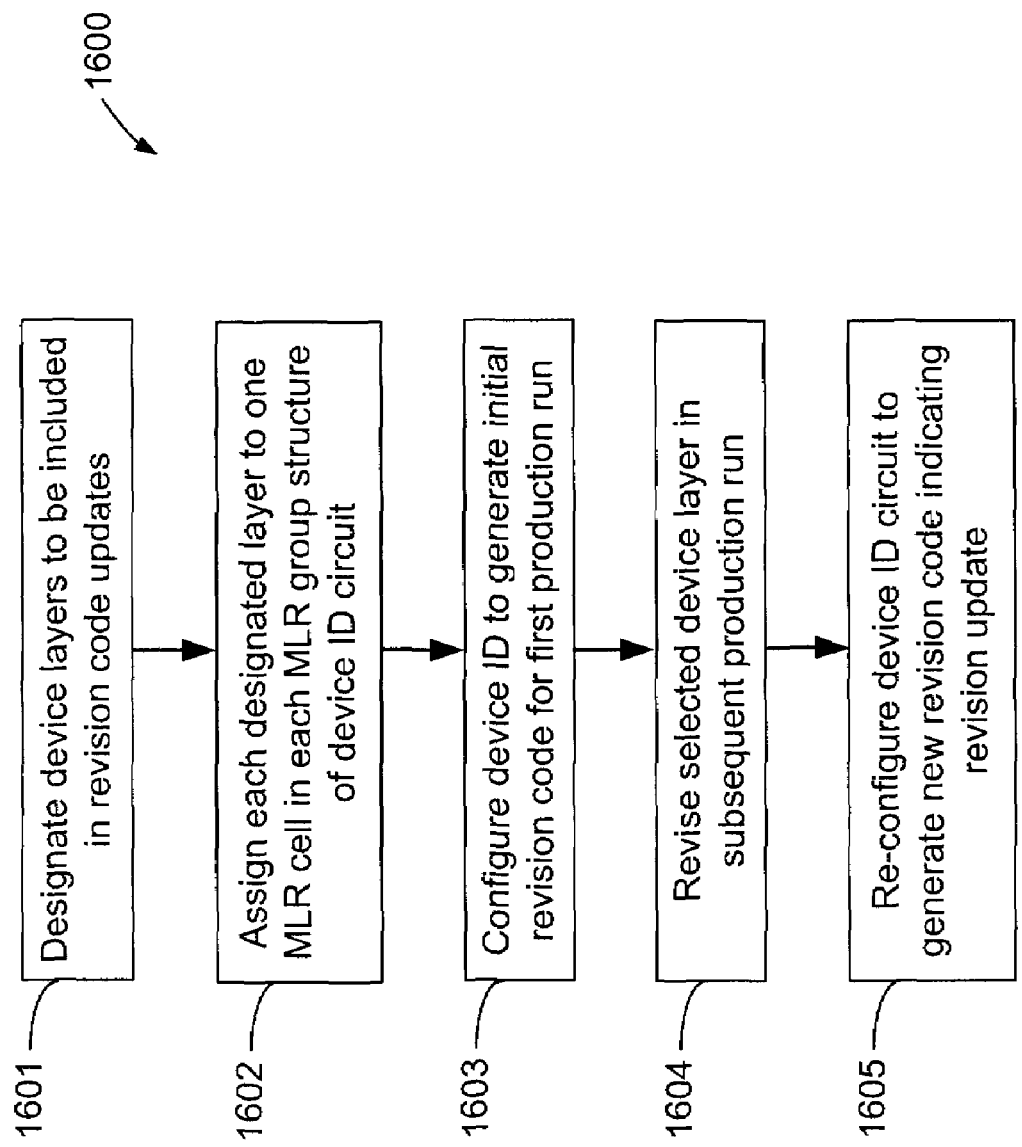
FIG. 16 is an illustrative flow chart depicting configuration and re-configuration operations of the exemplary device ID circuit of FIG. 15.

Referring also to FIG. 16, prior to fabrication, a number of device layers are designated to be included in revision code updates (step 1601), and each of the designated device layers is assigned to one MLR cell 1011 in each MLR group structure 1001 (step 1602). Thus, for the exemplary embodiment of FIG. 15, the first dielectric layer $D_1$ is assigned to the first MLR cell 1011(0) in each of MLR group structures 1001(0)-1001(1), the first metal layer $M_1$ is assigned to the second MLR cell 1011(1) in each of MLR group structures 1001(0)-1001(1), the second dielectric layer $D_2$ is assigned to the third MLR cell 1011(2) in each of MLR group structures 1001(0)-1001(1), and the second metal layer $M_2$ is assigned to the fourth MLR cell 1011(3) in each of MLR group structures 1001(0)-1001(1), as depicted in FIG. 15. As mentioned above, the number of device layers that may be designated for revision updates is determined by the number of MLR cells 1011 in each MLR group structure 1001.

Then, during a first or initial production run of the IC device, the device ID circuit 1500 is configured to generate an initial revision code (step 1603). The revision code may be initialized to any desired value (e.g., to indicate the first production run or first product design) by setting either an odd or even number of the MLR cells 1011 in each MLR cell group to logic 1 states. For purposes of discussion herein, the revision code is initialized to a value RC[1:0]="00" by setting all MLR cells 1011 of ID circuit 1500 to logic 0. Thus, within each MLR cell 1011, the continuity stack 1210A is configured to provide a continuous path between the cell output 1201 and ground potential, and continuity stack 1210B is configured to provide a discontinuous path between the cell output 1201 and VDD so that the MLR cell output signal B is initialized to logic "0."

More specifically, for the continuity stack 1210B in each MLR cell 1011, the continuity element 356 within the device layer assigned to the MLR cell is omitted to render the continuity stack 1210B discontinuous. For example, for MLR cells 1011(0), which are assigned to dielectric layer $D_1$, the continuity elements 356 of continuity stack 1210B residing within layer $D_1$ are removed to render continuity stacks 1210B non-conductive and thereby forcing corresponding cell output bits B0(0) and B0(1) to logic 0. For another example, for MLR cells 1011(1), which are assigned to metal layer $M_1$, the continuity elements 356 of continuity stack 1210B residing within layer $M_1$ are removed to render continuity stacks 1210B non-conductive and thereby forcing corresponding cell output bits B1(0) and B1(1) to logic 0. For the example of FIG. 15, the initial states of the MLR cell output signals B and the corresponding revision code bit RC are summarized below in Table 2A, which results in RC[1:0]="00."

TABLE 2A

| Assigned Layer | Group 0 state | Group 1 state |
|---|---|---|
| $D_1$ | B0 = 0 | B0 = 0 |
| $M_1$ | B1 = 0 | B1 = 0 |
| $D_2$ | B2 = 0 | B2 = 0 |
| $M_2$ | B3 = 0 | B3 = 0 |

Thereafter, when a selected layer in the IC device is revised, for example, during a subsequent production run or design revision (step 1604), the device ID circuit 1500 is modified to generate a new revision code that indicates the product revision (step 1605). More specifically, one (or both) of the MLR cells 1011 that are assigned to the revised device layer are re-configured from their initial states to toggle one (or both) of the RC bits by selectively reversing the conductive states of the continuity elements 356 within the revised device layer, thereby generating a new revision code that indicates the product revision.

For one example, if revisions are made to the first dielectric layer $D_1$, which for the example of FIG. 15 is assigned to the first MLR cell 1011(0) in each MLR group structure 1001(0)-1001(1), then the continuity elements 356 of the first MLR cell 1011(0) in group structure 1001(0) that reside within layer $D_1$ are re-configured to toggle the corresponding revision code bit RC(0) from logic 0 to logic 1. Thus, referring also to FIG. 12, the continuity element 356B of continuity stack 1210B of MLR cell 1011(0) residing within layer $D_1$ is re-inserted to render continuity stack 1210B conductive and the continuity element 356A of continuity stack 1210A of MLR cell 1011(0) residing within layer $D_1$ is removed, thereby changing the output signal B0(0) from logic 0 to logic 1, which in turn forces RC(0) to logic 1 via encoder circuit 1020(0), as summarized below in Table 2B, which results in RC[1:0]="01."

TABLE 2B

| Assigned Layer | Group 0 state | Group 1 state |
|---|---|---|
| $D_1$ | B0 = 1 | B0 = 0 |
| $M_1$ | B1 = 0 | B1 = 0 |
| $D_2$ | B2 = 0 | B2 = 0 |
| $M_2$ | B3 = 0 | B3 = 0 |

For another example, if subsequent revisions are then made to the second metal layer $M_2$, which for the example of FIG. 15 is assigned to the fourth MLR cell 1011(3) in each MLR group structure 1001(0)-1001(1), then the continuity elements 356 of the fourth MLR cell 1011(3) in MLR group structure 1001(1) that reside within layer $M_2$ may be re-configured to toggle the corresponding revision code bit RC(1) from logic 0 to logic 1. Thus, referring also to FIG. 12, the continuity element 356B of continuity stack 1210B of MLR cell 1011(3) residing within layer $M_2$ is re-inserted to render continuity stack 1210B conductive and the continuity element 356A of continuity stack 1210A of MLR cell 1011 (3) residing within layer $M_2$ is removed, thereby changing the output signal B3(1) from logic 0 to logic 1, which in turn forces RC(1) to logic 1 via encoder circuit 1020(1), as summarized below in Table 2C, which results in RC[1:0]="11."

TABLE 2C

| Assigned Layer | Group 0 state | Group 1 state |
|---|---|---|
| $D_1$ | B0 = 1 | B0 = 0 |
| $M_1$ | B1 = 0 | B1 = 0 |
| $D_2$ | B2 = 0 | B2 = 0 |
| $M_2$ | B3 = 0 | B3 = 1 |

As described above, changes in the continuity elements 356 in any device layer can result in the generation of any desired revision code, irrespective of the continuity stack configurations of MLR cells 1011 assigned to other device layers, and therefore the specific revision code changes described above with respect to Tables 2A-2C are merely illustrative. For example, for other embodiments, more than RC bit may be toggled to indicate a device revision.

Figure 17:
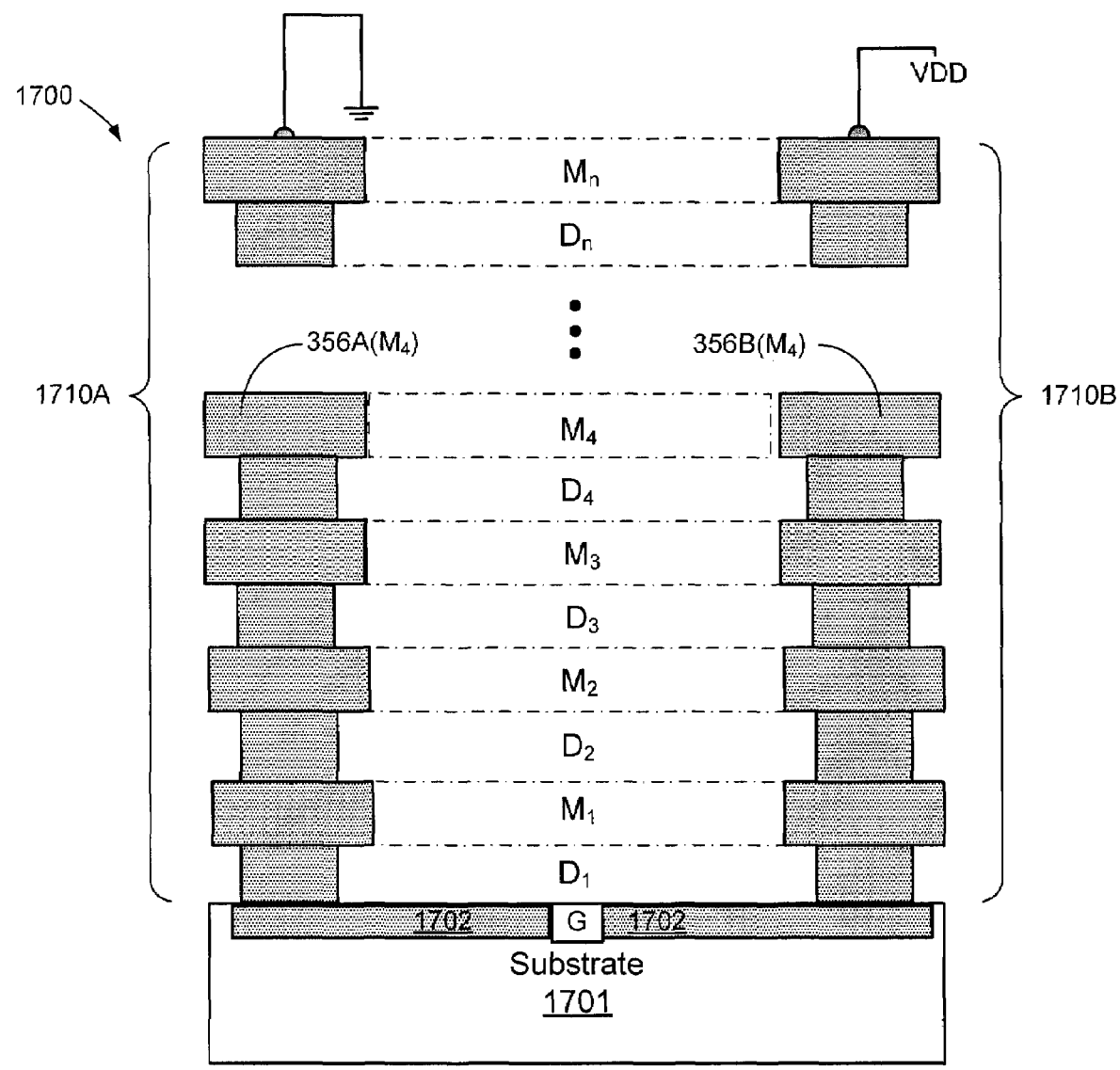
FIG. 17 is a cross-sectional view of one embodiment of the MLR cell of FIG. 10.

MLR cells 1200 may be implemented in an IC device in any suitable manner. For example, FIG. 17 shows an MLR cell 1700 that is one embodiment of MLR cell 1200 of FIG. 12. MLR cell 1700 includes a first continuity stack 1710A, a second continuity stack 1710B, and a conductive element 1702. Conductive element 1702 is formed in a substrate region 1701 of the IC device and electrically connects continuity stacks 1710A-1710B to the gate (G) of one or more corresponding CMOS transistors (not shown in FIG. 17 for simplicity) formed in substrate 1701 that implement encoder circuit 1020. Continuity stack 1710A, which is one embodiment of continuity stack 1210A of FIG. 12, selectively connects G to ground potential through continuity elements 356A formed in various device layers $D_1$, $M_1$, to $D_n$, $M_n$. Continuity stack 1710B, which is one embodiment of continuity stack 1210B of FIG. 12, selectively connects G to VDD through continuity elements 356B formed in various device layers $D_1$, $M_1$, to $D_n$, $M_n$.

MLR cell 1700 can be selectively configured to drive the gate G of the corresponding CMOS transistors of encoder circuit 1020 to either logic 1 or logic 0 by selectively omitting a continuity element in either continuity stack 1710A or continuity stack 1710B, respectively, in any of the device layers. For example, to configure MLR cell 1700 to a logic 1 state using metal layer $M_4$, continuity element 356A($M_4$) may be removed (e.g., by replacing conductive material in the continuity element with an insulting material) so that continuity stack 1710A is discontinuous and G is pulled high to VDD through continuity stack 1710B. Conversely, to configure MLR cell 1700 to a logic 0 state using metal layer $M_4$, continuity element 356B($M_4$) may be removed (e.g., by replacing conductive material in the continuity element with an insulting material) so that continuity stack 1710B is discontinuous and G is pulled low to ground potential through continuity stack 1710A.

Figure 18:
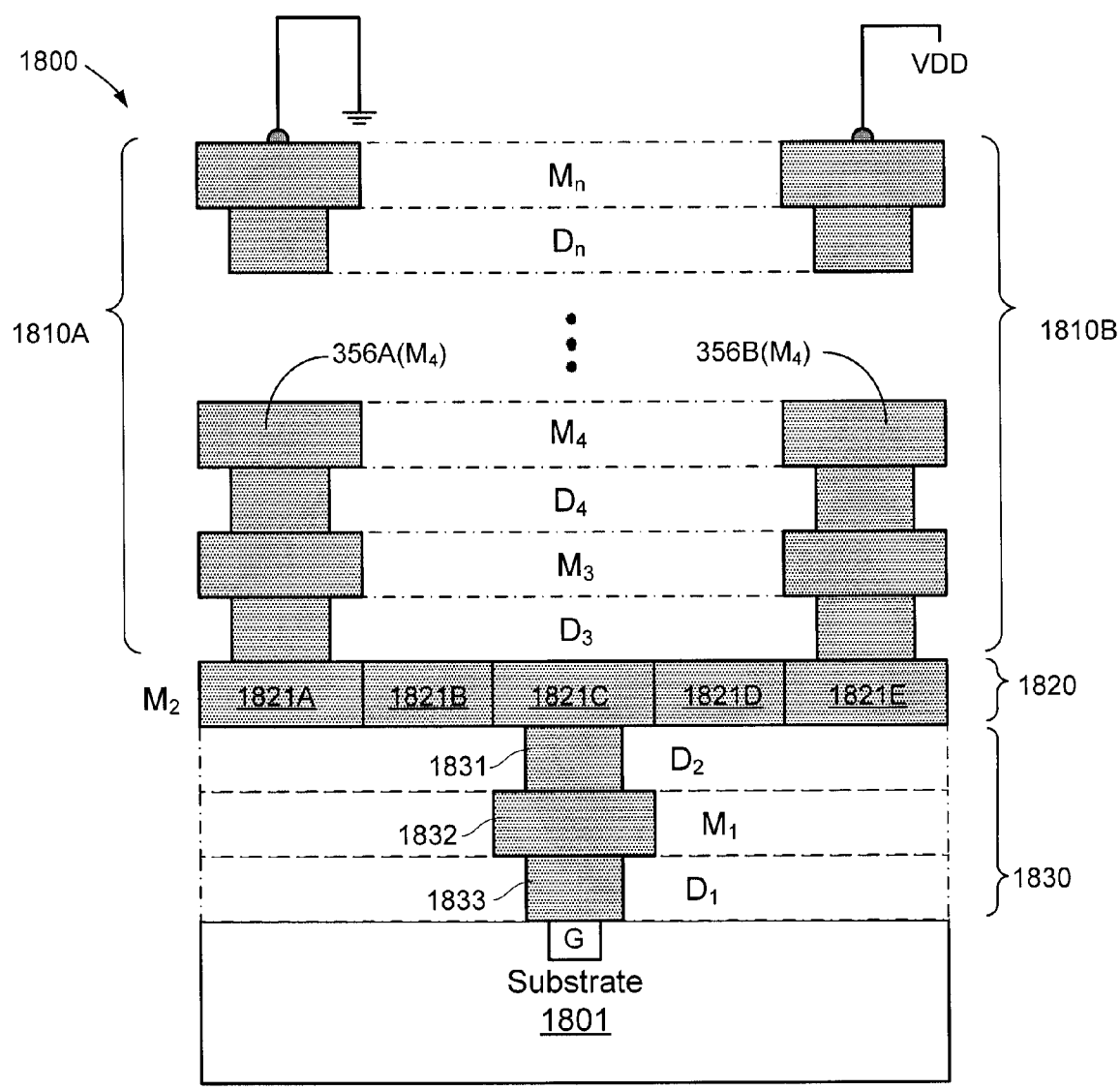
FIG. 18 is a cross-sectional view of another embodiment of the MLR cell of FIG. 10.

For other embodiments, the architecture of each MLR cell may vary according to which device layer the MLR cell is assigned to, for example, by including a conductive bridge formed in the device layer that is assigned to the MLR cell. FIG. 18 shown an MLR cell 1800 that is another embodiment of MLR cell 1200 of FIG. 12. MLR cell 1800, which for the exemplary embodiment of FIG. 18 is tailored for assignment to metal layer $M_2$, includes a first continuity stack 1810A, a second continuity stack 1810B, a conductive bridge 1820 formed in the $M_2$ layer, and a continuity stack 1830 extending between layer $M_2$ and a substrate 1801 within which CMOS transistors (not shown for simplicity) that implement encoder circuit 1020 are formed. Continuity stack 1810A is coupled between ground potential and conductive bridge 1820, and continuity stack 1810B is coupled between VDD and conductive bridge 1820. Conductive bridge 1820, which includes continuity elements 1821A-1821E formed in layer $M_2$, is coupled to the gate (G) of the CMOS transistors that implement the encoder circuit through continuity stack 1830. For the exemplary embodiment of FIG. 18, continuity stack 1830 includes continuity elements 1831-1833 formed in layers $D_2$, $M_1$, and $D_1$, respectively. For other embodiments, MLR cell 1800 may be fabricated for assignment to another device layer, for example, by forming conductive bridge 1820 in that layer and extending continuity stack 1830 from the conductive bridge to the gate G of the CMOS transistors.

To configure MLR cell 1800 to a desired state, one of continuity elements 1821B and 1821D may be configured as a conductive element (e.g., by forming the element using a conductive material) and the other of continuity elements 1821B and 1821D may be configured as a non-conductive element (e.g., by forming the element using an insulting material). For example, to configure MLR cell 1800 to a logic 0 state, continuity element 1821B is formed using a conductive material to connect the gate G to ground potential through continuity stack 1810A, and continuity element 1821D is formed using an insulting material to isolate the gate G from continuity stack 1810B and VDD. Conversely, to configure MLR cell 1800 to a logic 1 state, continuity element 1821D is formed using a conductive material to connect the gate G to VDD through continuity stack 1810B, and continuity element 1821B is formed using an insulating material to isolate the gate G from continuity stack 1810A and ground potential.

For other embodiments, various combinations of the architectural elements of MLR cells 1700 and 1800 can be combined to form other embodiments of the MLR cell to selectively connect the gate G to either ground potential or to VDD.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

The invention claimed is:

1. An integrated circuit (IC) device, comprising:
  a semiconductor substrate;
  a plurality of device layers formed over the substrate; and
  a plurality of multi-level revision (MLR) group structures, each having an output to generate a corresponding one of a plurality of bits of a revision code and comprising:
   a plurality of MLR cells each extending through the device layers and having an output for generating a corresponding output signal; and
   a parity circuit having a plurality of inputs each coupled to the output of a corresponding MLR cell in the MLR group structure, and having an output to generate the corresponding bit of the revision code.

2. The IC device of claim 1, wherein the MLR cells do not consume static DC power.

3. The IC device of claim 1, wherein each device layer is assigned to one MLR cell in each of the MLR group structures.

4. The IC device of claim 1, wherein for each MLR group structure, the MLR cells are assigned to different device layers.

5. The IC device of claim 1, wherein the revision code indicates design revisions in any of the device layers.

6. The IC device of claim 5, wherein the revision codes are assigned to the design revisions in a non-sequential manner.

7. The IC device of claim 1, wherein for each MLR group structure, the logic state of the corresponding bit of the revision code is controllable by anyone of the MLR cell output signals in the MLR group structure.

8. The IC device of claim 1, wherein each bit of the revision code indicates a parity of the MLR cell output signals generated in the corresponding MLR group structure.

9. The IC device of claim 1, wherein each parity circuit performs an exclusive-OR type logical combination of the MLR cell output signals within the corresponding MLR group structure.

10. The IC device of claim 1, wherein each parity circuit is implemented by a number of transistors formed in the substrate, and the output of each MLR cell of the corresponding MLR group structure is coupled to a gate of one or more of the transistors.

11. The IC device of claim 10, wherein each MLR cell includes a first continuity stack extending from the gate of the transistor and a first supply voltage provided on a top layer of the device, and includes a second continuity stack extending from the gate of the transistor and a second supply voltage provided on the top layer of the device.

12. The IC device of claim 1, wherein each MLR cell comprises:
  a first switching element coupled between the cell output and a first supply voltage; and
  a second switching element coupled between the cell output and a second supply voltage.

13. The IC device of claim 12, wherein:
  the first switching element comprises a first continuity stack formed by a series connection of first continuity elements extending through all the device layers; and
  the second switching element comprises a second continuity stack formed by a series connection of second continuity elements extending through all the device layers.

14. The IC device of claim 13, wherein each device layer includes a corresponding pair of the first and second continuity elements.

15. The IC device of claim 13, wherein:
  in a first state, the first continuity elements electrically connect the cell output to the first supply voltage and the second continuity elements electrically isolate the cell output from the second supply voltage; and
  in a second state, the second continuity elements electrically connect the cell output to the second supply voltage and the first continuity elements electrically isolate the cell output from the first supply voltage.

16. An integrated circuit (IC) device including a number of multi-level revision (MLR) structures to generate a revision code, each MLR group structure comprising:
  a plurality of MLR cells each extending through a plurality of layers of the device and each having an output selectively connected either to a supply voltage or to ground potential; and
  a parity circuit having a plurality of inputs each coupled to the output of a corresponding MLR cell in the MLR group structure, and having an output to generate a corresponding bit of the revision code.

17. The IC device of claim 16, wherein the MLR cells do not consume static DC power.

18. The IC device of claim 16, wherein the revision code indicates design revisions in any of the device layers.

19. The IC device of claim 16, wherein the revision codes are assigned to the design revisions in a non-sequential manner.

20. The IC device of claim 16, wherein for each MLR group structure, the logic state of the corresponding bit of the revision code is controllable by any one of the MLR cell output signals in the MLR group structure.

21. The IC device of claim 16, wherein each bit of the revision code indicates a parity of the MLR cell output signals generated in the corresponding MLR group structure.

22. The IC device of claim 16, wherein each parity circuit performs an exclusive-OR type logical combination of the MLR cell output signals within the corresponding MLR group structure.

23. The IC device of claim 16, wherein each MLR cell comprises:
  a first switching element coupled between the cell output and the supply voltage; and
  a second switching element coupled between the cell output and ground potential.

24. The IC device of claim 23, wherein:
  the first switching element comprises a first continuity stack formed by a series connection of first continuity elements extending through all the device layers; and
  the second switching element comprises a second continuity stack formed by a series connection of second continuity elements extending through all the device layers.

25. The IC device of claim 24, wherein each device layer includes a corresponding pair of the first and second continuity elements.

26. The IC device of claim 24, wherein:
  in a first state, the first continuity elements electrically connect the MLR cell output to the supply voltage and the second continuity elements electrically isolate the MLR cell output from ground potential; and
  in a second state, the second continuity elements electrically connect the MLR cell output to ground potential and the first continuity elements electrically isolate the MLR cell output from the supply voltage.

* * * * *